United States Patent
Peterson et al.

[11] Patent Number: 5,950,327
[45] Date of Patent: Sep. 14, 1999

[54] METHODS AND APPARATUS FOR CLEANING AND DRYING WAFERS

[75] Inventors: Glenn E. Peterson, Glendale; Eric Shurtliff, Phoenix, both of Ariz.

[73] Assignee: SpeedFam-IPEC Corporation, Chandler, Ariz.

[21] Appl. No.: 08/676,546

[22] Filed: Jul. 8, 1996

[51] Int. Cl.⁶ ..................................................... F26B 5/08
[52] U.S. Cl. .................................. 34/328; 34/312; 34/58; 134/61; 134/902
[58] Field of Search ............................ 34/58, 312, 317, 34/328; 134/61, 95.2, 102.1, 102.3, 902; 15/77, 88.3

[56] References Cited

U.S. PATENT DOCUMENTS

| | | | |
|---|---|---|---|
| 3,939,514 | 2/1976 | Cook | 15/88.2 |
| 4,805,348 | 2/1989 | Arai et al. | 51/118 |
| 5,099,614 | 3/1992 | Arai et al. | 51/165 |
| 5,203,360 | 4/1993 | Nguyen et al. | 134/78 |
| 5,213,451 | 5/1993 | Frank | 406/72 |
| 5,329,732 | 7/1994 | Kalsrud et al. | 51/131.5 |
| 5,357,645 | 10/1994 | Onodera | 15/97.1 |
| 5,431,178 | 7/1995 | Chiu | 134/57 R |
| 5,442,828 | 8/1995 | Lutz | 15/88.3 |
| 5,498,196 | 3/1996 | Kalsrud et al. | 451/11 |
| 5,498,199 | 3/1996 | Karlsrud et al. | 451/289 |

FOREIGN PATENT DOCUMENTS

| | | |
|---|---|---|
| 0 412 796 A2 | 2/1991 | European Pat. Off. . |
| 0 795 892 A1 | 9/1997 | European Pat. Off. . |
| 02 250 324 | 10/1990 | Japan . |

OTHER PUBLICATIONS

Patent Abstracts of Japan, vol. 14, No. 576 (E–1016) Dec. 21 1990 & JP 02 250324(Hitachi), Oct. 8, 1990 (see abstract).
Carufe: "wafer precleaning" IBM Technical Disclosure Bulletin, vol. 17, No. 2, Jul. 2, 1974, New York, US p. 427 X002045902.

*Primary Examiner*—Henry Bennett
*Assistant Examiner*—Pamela A. Wilson
*Attorney, Agent, or Firm*—Snell & Wilmer

[57] ABSTRACT

The present invention relates to a wafer cleaning machine having an input station, a water track, a cleaning station, a rinsing station, a spin-dry station, and a load station. The input station includes two or more wafer supply areas for a continuous supply of wafers to the water track. After the wafers enter the water track from the input station, the wafers are transported down the track into the wafer cleaning station. The wafer cleaning station comprises a plurality of pairs of rollers which pull the wafers through the cleaning station and thereby clean the top and bottom flat surfaces of the wafers. A cleaning fluid manifold formed within the upper panel of the cleaning station facilitates effective distribution of the cleaning fluid to the rollers. From the cleaning station, the wafers are transported to a rinse station. From the rinsing station, the workpieces are transferred to a dual spin-dry station. At the spin-dry station, the workpieces are spun at a high speed to remove any residual water droplets or the like. From the dual spin-dry station, a robotic transfer arm removes the work pieces from the spin-dry station and places them in one of a pair of unload cassettes. After the cassettes are filled with wafers, they are removed and transferred for subsequent processing.

41 Claims, 19 Drawing Sheets

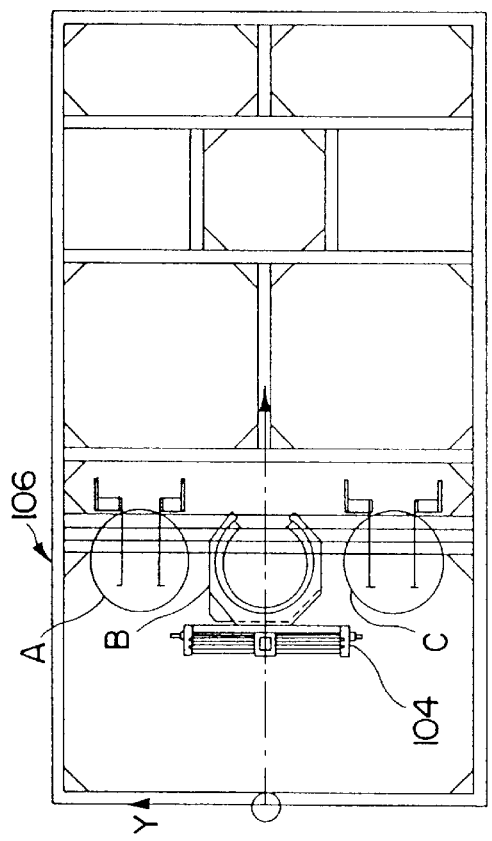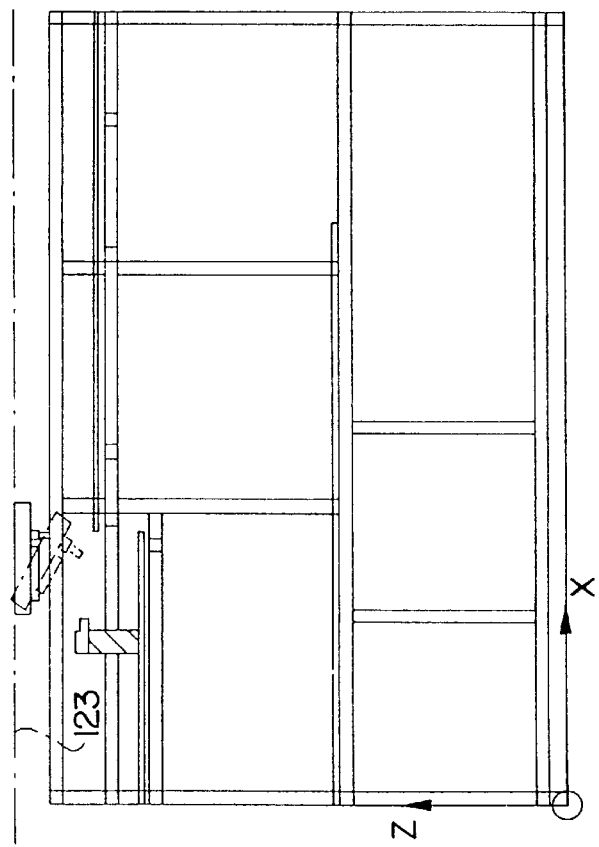

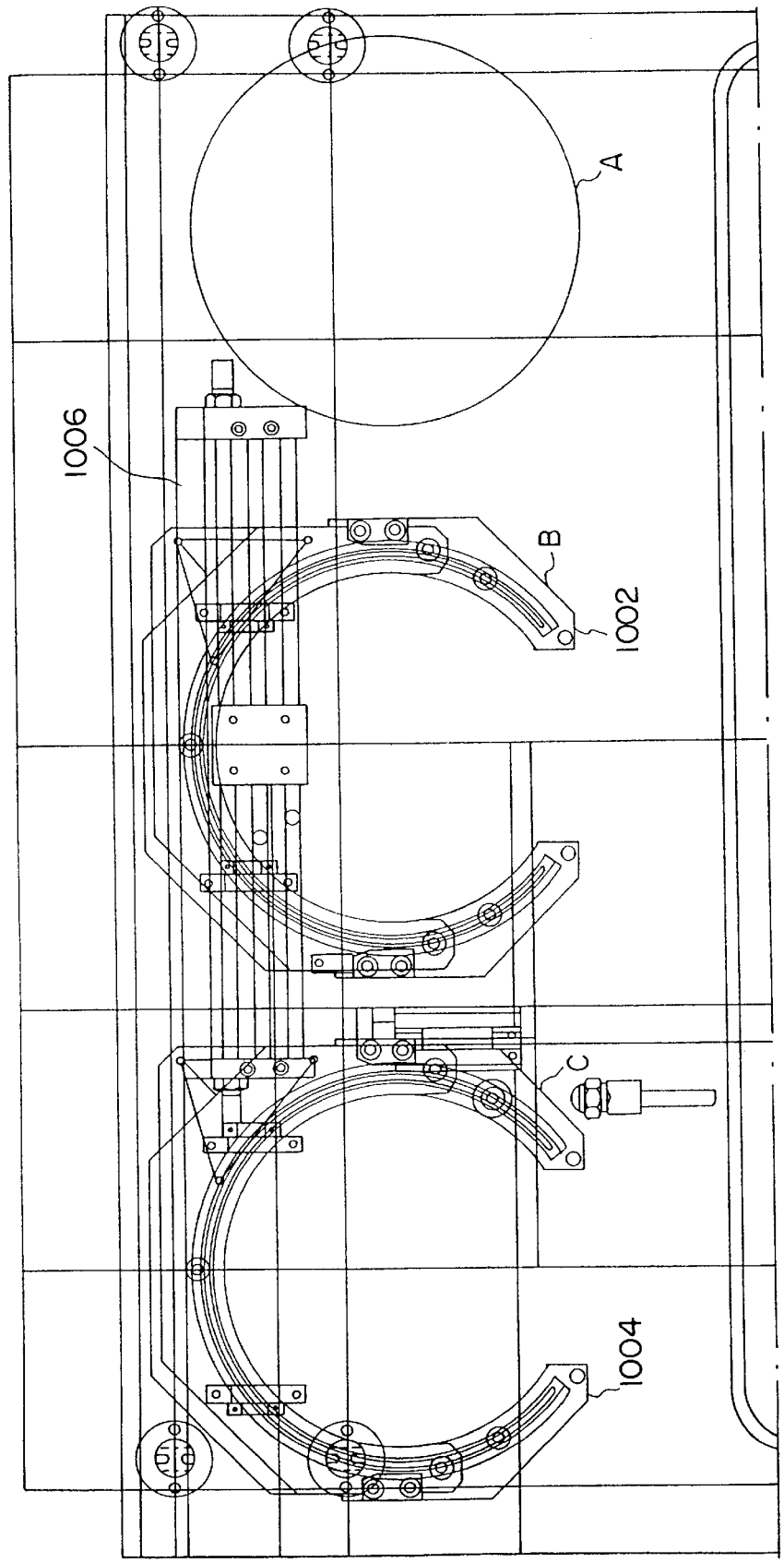
FIG. II

METHODS AND APPARATUS FOR CLEANING AND DRYING WAFERS

TECHNICAL FIELD

The present invention relates, generally, to a self-contained machine for cleaning, rinsing, and spin-drying semiconductor wafer workpieces and, more particularly, to an improved system having a dual input, single water track input mechanism and dual rinse and spin-dry assemblies.

BACKGROUND ART AND TECHNICAL PROBLEMS

Machines for cleaning wafers and disks in the electronics industry are generally well known. For example, semiconductor wafers, magnetic disks, and other workpieces often come in the form of flat, substantially planar, circular disks. In the manufacture of integrated circuits, semiconductor wafer disks are sliced from a silicon ingot and prepared for further processing. After each wafer is sliced from the ingot, it must be thoroughly cleaned, rinsed, and dried to remove debris from the surface of the wafer. Thereafter, a series of steps are performed on the wafer to build the integrated circuits on the wafer surface, including applying a layer of microelectronic structures, followed by the application of a dielectric layer. Often, the disks must be planarized upon the application of the dielectric layer. For a discussion of chemical mechanical planarization (CMP) processes and apparatus, see, for example, Arai, et al., U.S. Pat. No. 5,099,614, issued March 1992; Karlsrud, U.S. Pat. No. 5,498,196, issued March 1996; Arai, et al., U.S. Pat. No. 4,805,348, issued February 1989; Karlsrud et al., U.S. Pat. No. 5,329,732, issued July 1994; and Karlsrud et al., U.S. Pat. No. 5,498,199, issued March 1996.

After each processing step, it is often desirable to thoroughly clean, rinse, and dry the workpiece to ensure that all debris is removed from the workpiece. Thus, methods and apparatus for quickly and efficiently cleaning, rinsing, and drying wafers are needed which facilitate high workpiece throughput, while at the same time thoroughly cleaning and drying the wafers with a minimum of wafer breakage. For a discussion of existing wafer cleaning machines, see, for example, Lutz U.S. Pat. No. 5,442,828 issued on Aug. 22, 1995; Frank, et al., U.S. Pat. No. 5,213,451 issued on May 25, 1993; and Onodera, U.S. Pat. No. 5,357,645, issued on Oct. 25, 1994.

Presently known wafer cleaning machines are unsatisfactory in several regards. For example, as the demand increases for semiconductor products, and in particular integrated circuit devices, the need for higher throughput wafer cleaning machines has correspondingly increased. However, the single input configuration of presently known wafer cleaning machines continues to impede throughput.

In addition, the pressure on wafer cleaning machine manufacturers to increase throughput has driven many manufacturers to design machines with high rotational spin rates (e.g., 1,800–2,200 rpm) to spin-dry the wafers very quickly. In so doing, the industry is currently experiencing an unacceptably high level of wafer breakage in the spin-dry operation. This breakage can be quite costly, particularly for wafers which comprise integrated circuits in the latter stages of processing.

A wafer cleaning machine is thus needed which overcomes the shortcomings of the prior art.

SUMMARY OF THE INVENTION

In accordance with the present invention, a wafer cleaning machine is provided which overcomes many of the shortcomings of the prior art.

In accordance with a preferred embodiment of the present invention, a single water track is employed to serially introduce wafers into the wafer cleaning station of the present invention. In order to increase throughput and permit the subject wafer cleaning machine to operate substantially continuously, two or more wafer input stations are configured to supply wafers to the single water track. In this way, as one cassette of wafers is being discharged from a first cassette load station into the water track for further processing, the operator may load a full cassette of wafers into a second cassette unload station. When the first load station has ejected all of the wafers from the cassette, a cassette-present sensor in the second load station senses the presence of the second fully loaded cassette, and begins feeding wafers from the second load station into the water track in a substantially uninterrupted sequence. While the second wafer cassette load station is supplying wafers to the water track, the operator may load a new cassette full of wafers to be cleaned into the first cassette load station; alternatively, the loading of full cassettes into the respective load stations may be performed in an automated fashion without the need for a human operator.

In accordance with a further aspect of the present invention, the single water track feeds the wafers into a single cleaning station wherein both surfaces of each wafer are washed and cleaned. In accordance with a particularly preferred embodiment, the wafer cleaning station comprises a plurality of pairs of rollers; the rollers pull the wafers through the cleaning station and thereby clean the top and bottom flat surfaces of the wafers. More particularly, various of the rollers within the roller box operate at different rotational speeds. In this way, certain of the rollers may function as drive rollers to move the wafer through the cleaning station, while other rollers may operate at different rotational speeds to thereby clean the surfaces of the wafers as they are driven through the cleaning station.

In a particularly preferred embodiment of the present invention, the various rollers in the cleaning station are all contained in an enclosed box which may be easily removed from the machine to facilitate the convenient changing of the rollers as the roller surfaces become worn through extended use. In accordance with a further aspect of a preferred embodiment of the invention, a plurality of channels are configured in an upper inside surface of the roller box to permit the distribution of a plurality of different chemicals (e.g., water, cleaning solution, surfactants, friction reducing agents, and agents to control the pH of the various solutions) into discrete regions of the roller box. In this way, a workpiece passing through a first set of rollers may be exposed to a first chemical solution, whereupon the same wafer may be subsequently exposed to a second chemical solution in a latter stage of the roller box.

In accordance with a further aspect of the present invention, the roller box is configured to output disks into a rinse station. In accordance with a particularly preferred embodiment, the rinse station suitably comprises two substantially identical rinse rings each connected to a shuttle arm configured to shuttle back and forth to thereby facilitate higher workpiece throughput. In particular, the two rinse rings are alternately cycled from a left position to a right position during operation. When in the left position, a first rinse ring is configured to receive a workpiece from the roller box, while the second rinse ring is configured to tilt downwardly from the horizontal plane so that the top, bottom, and edge surfaces of the workpiece may be simultaneously rinsed. After the workpiece in the second rinse ring is rinsed, the second rinse ring tilts back to the horizontal position whereupon the rinsed workpiece is retrieved by a robotic arm from the second rinse ring. The rinse ring assembly then shuttles to the right position, whereupon the empty second rinse ring receives another workpiece from the roller box. At the same time, the first rinse ring is tilted downwardly, whereupon the workpiece is rinsed. The first rinse ring then returns to the horizontal position, whereupon a robotic arm retrieves the rinsed workpiece and transfers it to the spin-dry station. By shuttling from left to right in the aforementioned manner, workpiece throughput is dramatically enhanced.

In accordance with a further aspect of a preferred embodiment, the rinse rings are configured to support the workpieces with a ring of water jets, such that mechanical contact with the workpieces is minimized.

In accordance with a further aspect of the present invention, upon being retrieved from the rinse station the workpieces are transferred to a dual spin-dry station. More particularly, a first spin-dry station is configured to sequentially retrieve rinsed workpieces from the first rinse ring, and a second spin-dry station is configured to sequentially retrieve workpieces from the second rinse ring. In accordance with a particularly preferred embodiment, each spin-dry station is equipped with a spin motor which is tuned to the particular type of workpieces being spun. More particularly, a spin-dry station may be tuned by placing a dummy workpiece on the spinner, and allowing the spinner motor to self-tune to the operating environment, including spin speeds in the range of 4,000 rpm, to thereby substantially eliminate harmonics, vibrations, and the like due to the spinner motor through the use of self-adjustment programs resident in the motor. By eliminating harmonics, vibrations, and the like imparted to the system by the motor, very high spin speeds may be employed while minimizing workpiece breakage.

In accordance with a further aspect of the present invention, a pair of unload cassettes are employed, each being configured to receive workpieces from both spin-dry stations. Thus, as one unload cassette becomes filled with clean, dry wafers, the machine may be configured to begin filling a second unload cassette with clean, dry workpieces. As the second unload cassette is being filled, the first unload cassette may be removed (manually or automatically) from the machine to thereby permit substantially continuous, uninterrupted operation of the subject wafer cleaning machine.

In accordance with a further aspect of the present invention, the flow of fluids to the wafer load station, water track, cleaning station, and rinse stations are suitably controlled through the use of a fluid flow regulator system, which monitors the flow of fluid, as opposed to prior art systems which typically measure fluid pressure. By measuring fluid flow directly, the system is less susceptible to variations in inlet fluid pressure. Fluid flows within the system may thus be much more accurately controlled than is possible with prior art systems.

In accordance with a further aspect of the present invention, an operator interface suitably comprises a flat panel touch screen. The touch screen is advantageously configured to present the operator with a three-dimensional graphical image of virtually every relevant aspect of the system to facilitate operation, maintenance, troubleshooting, and the like.

BRIEF DESCRIPTION OF THE DRAWING FIGURES

The present invention will hereinafter be described in conjunction with the appended drawing figures, wherein like numerals generally denote like elements, and:

FIG. 10A is a schematic top plan view of the rinse station shown in FIG. 1;

FIG. 10B is a schematic front elevation view of the rinse station shown in FIG. 10A;

FIG. 11 is a detailed view of the rinse ring shuttle assembly of FIG. 10A, shown in the shifted right position;

DETAILED DESCRIPTION OF PREFERRED EXEMPLARY EMBODIMENTS

Figure 1:
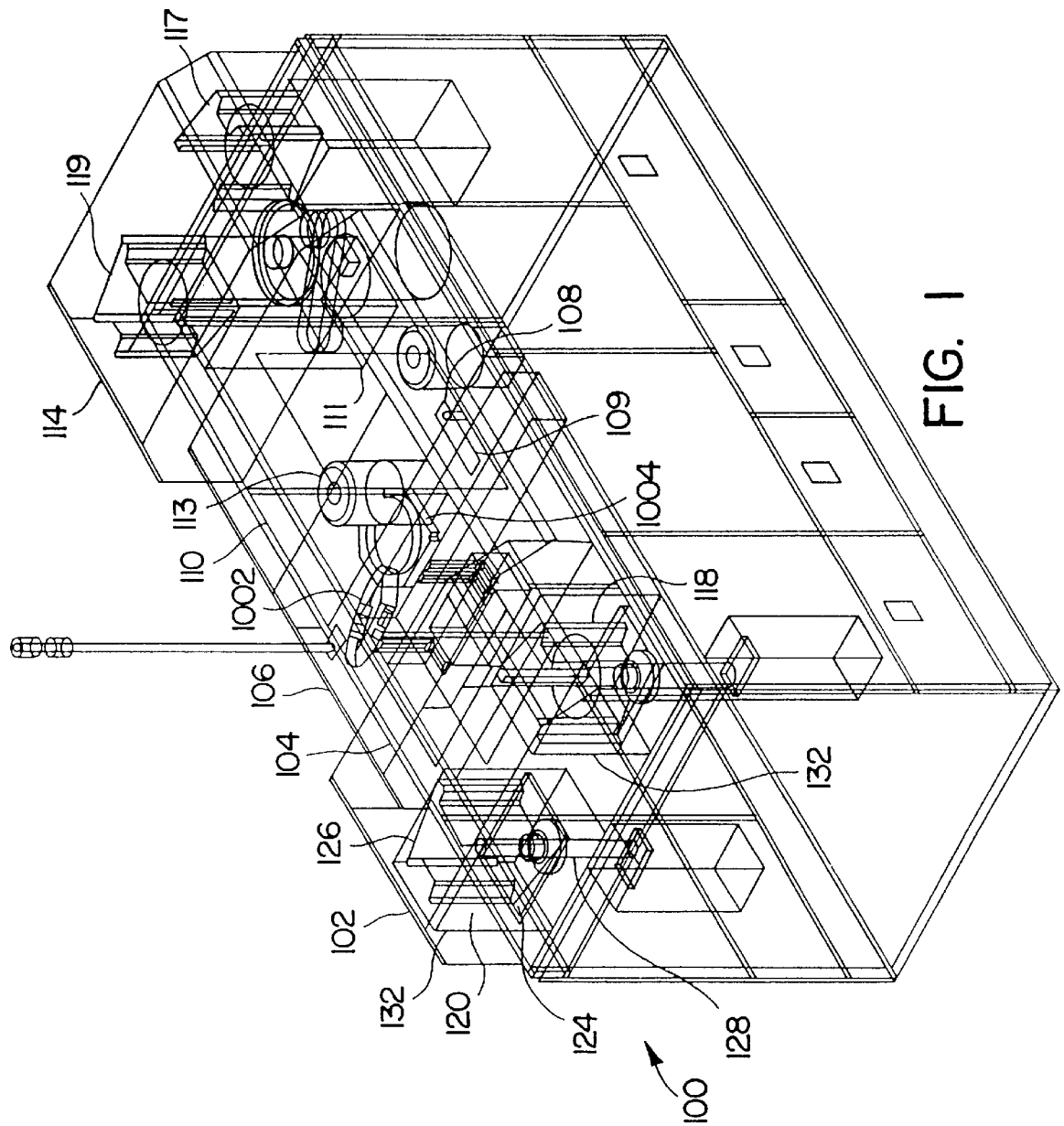
FIG. 1 is a perspective schematic view of a preferred exemplary embodiment of an enclosed, self-contained machine comprising a dual input, single track machine for washing, rinsing, spin-drying, and unloading in a continuous manner wafer disk workpieces in accordance with the present invention.
Figure 2:
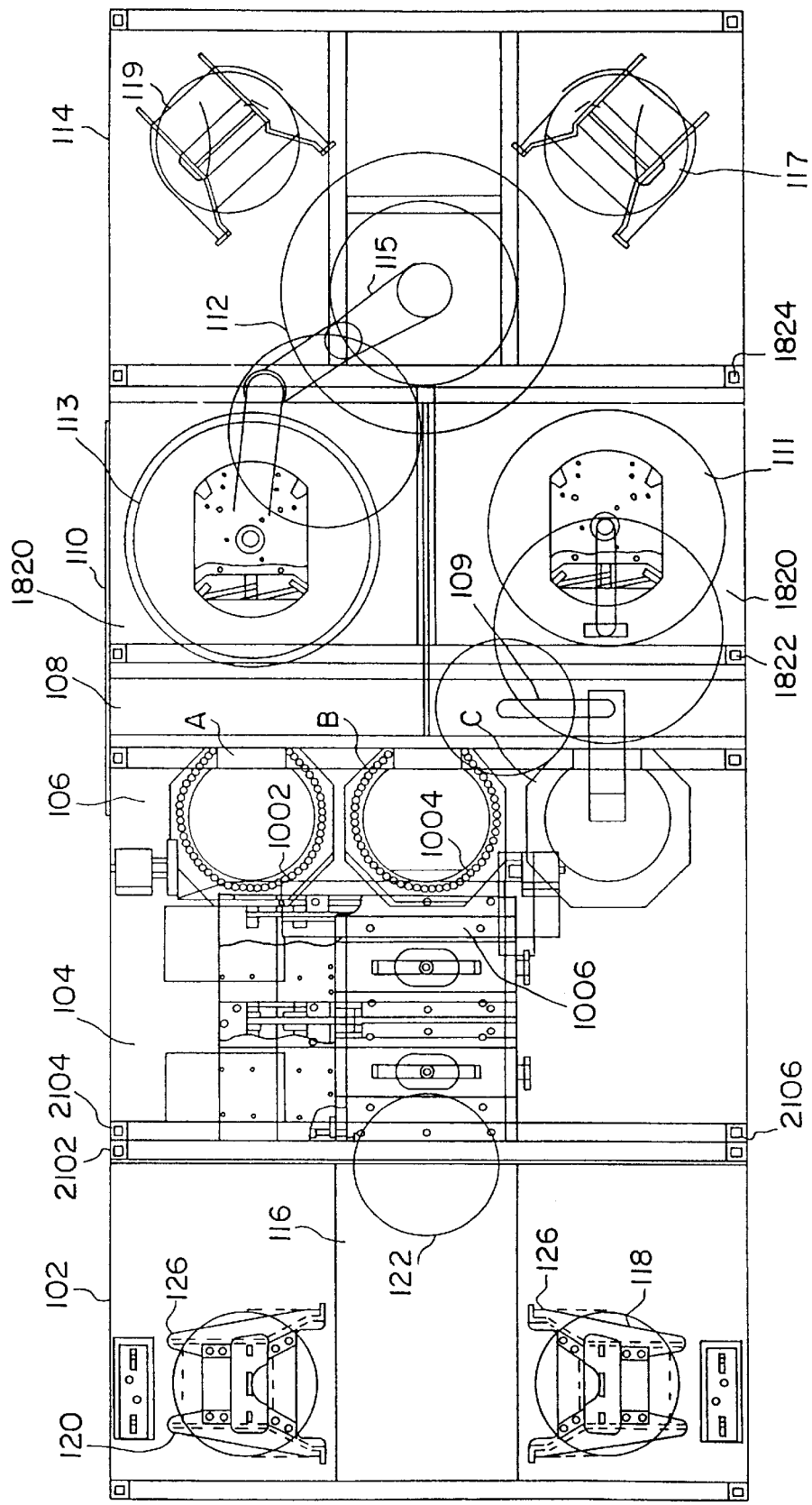
FIG. 2 is a top schematic plan view of an exemplary embodiment of the machine shown in FIG. 1.

Referring now to FIGS. 1 and 2, an exemplary embodiment of a wafer cleaning machine 100 suitably comprises a wafer load station 102, a water track transport assembly 116, a scrubber station 104, a rinse station 106, a first transfer station 108, a spin-dry station 110, a second transfer station 112, and a wafer unload station 114. Each of the foregoing stations are structurally and functionally described in greater detail below.

With continued reference to FIGS. 1 and 2, in accordance with one aspect of the present invention, wafer load station 102 is suitably configured to accommodate at least two (2) wafer cassettes to permit the substantially continuous operation of machine 100. That is, a first wafer load assembly 118 is configured to receive a cassette full of wafers to be cleaned. In this regard, although the present invention is described in the context of exemplary workpieces 122 comprising semiconductor wafers, virtually any substantially flat, substantially circular workpieces may suitably be employed in the context of the present invention.

As individual workpieces 122 are individually discharged from first cassette assembly 118, the operator may install a second cassette filled (partially or fully) with wafers to be cleaned in second cassette assembly 120. In this way, when all of the workpieces from cassette assembly 118 have been serially discharged into water track 116, the wafers resident in cassette assembly 120 may immediately thereafter begin being output into water track 116. While the wafers are being discharged from cassette assembly 120, the operator may install a new cassette of wafers to be cleaned within cassette assembly 118. Accordingly, substantially continuous, uninterrupted input of wafers into machine 100 may be achieved, facilitating substantially higher workpiece throughput than previously achievable with presently known wafer cleaning machines.

For a more detailed discussion of wafer cassettes and cassettes useful in the context of machine 100, see, for example, U.S. patent application Ser. No. 08/671,155, entitled "Adjustable Wafer Cassette Stand", filed Jun. 28, 1996, now U.S. Pat. No. 5,779,203 in the name of Erich Edlinger, the entire contents of which are hereby incorporated into this application by this reference.

With continued reference to FIGS. 1 and 2, although respective first and second cassette assemblies 118, 120 are shown in a substantially "T-shaped" configuration (as illustrated in FIGS. 1 and 2), it will be understood that any suitable configuration may be employed to conveniently discharge workpieces from the cassette into water track 116. For example, a "Y" configuration, or a modified "T" configuration in which the workpieces are not directed toward the opposing cassette assembly may be employed in the context of the present invention, as described in greater detail below.

As best seen in FIG. 1, each cassette assembly 118, 120 suitably comprises a platform 124 which supports a cassette 126 filled with workpieces 122. An elevator assembly 128, for example a servo assembly, stepper motor, torque motor assembly, or the like, is suitably configured to raise platform 124 to the position shown in FIG. 1, wherein cassettes which are either partially or fully filled with workpieces may be loaded into the machine.

In the context of many workpiece cleaning processes, it is desirable to maintain the workpieces in a wet environment prior to being processed by machine 100. Thus, in accordance with one aspect of the present invention, each cassette assembly 118, 120 further comprises a tank or chamber 132 which may be suitably filled with a desired fluid, for example, deionized water which may include surfactants, cleaning agents, pH controlling agents, and the like. Elevator assembly 128 is suitably configured to extend into tank 132 to thereby control the vertical position of cassette 126 within tank 132.

The manner in which wafers are individually discharged from a cassette will now be described in the context of a preferred embodiment of the invention.

Figure 3:
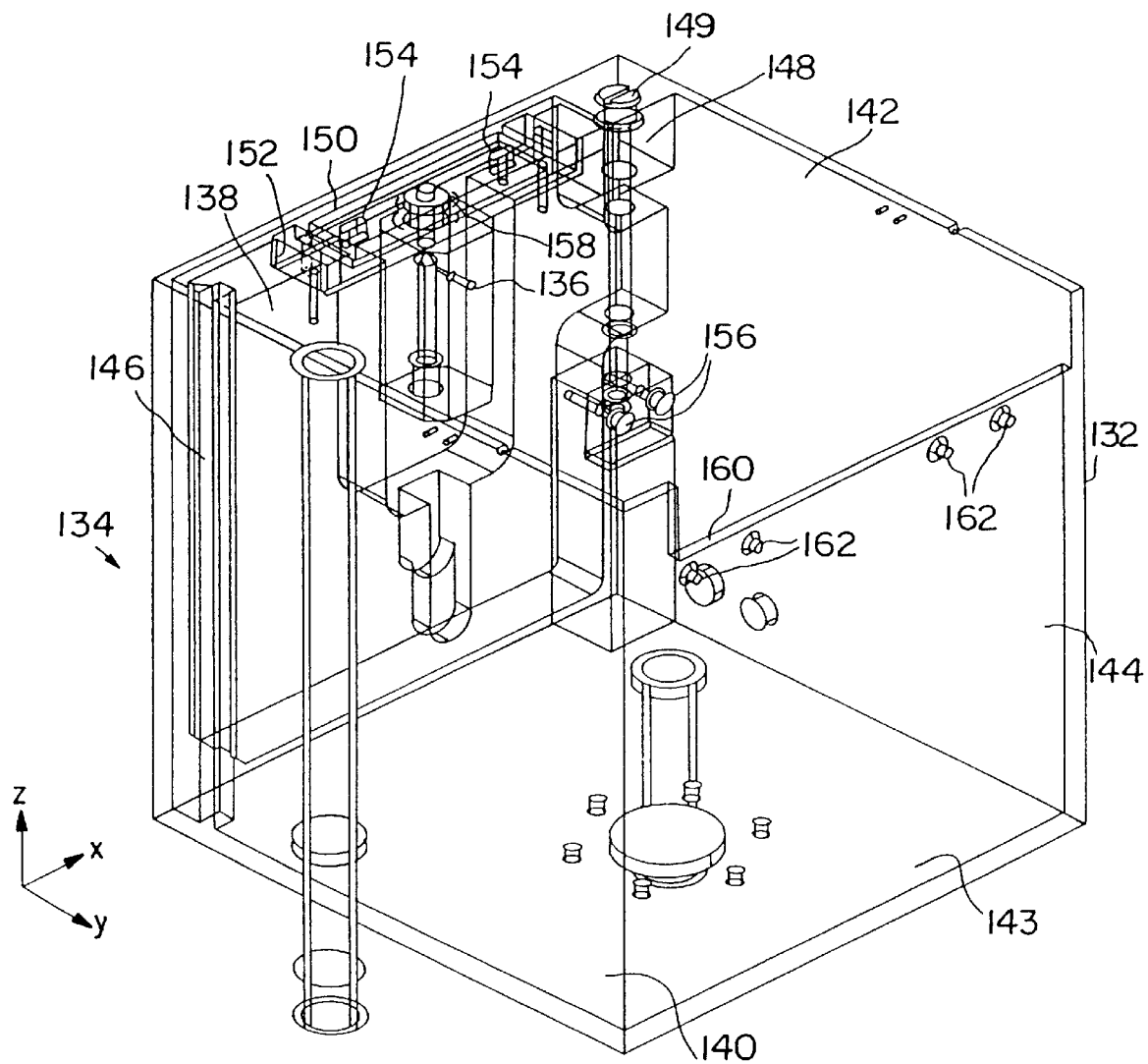
FIG. 3 is a schematic perspective view of an exemplary discharge mechanism for urging workpieces from the cassettes shown in FIG. 1.

Referring now to FIGS. 1–3, a wafer discharge assembly 134 suitably comprises soak tank 132 configured to maintain cassette 126 immersed in fluid. Workpiece discharge assembly 134 further comprises a nozzle 136 configured to forcibly discharge a fluid stream toward the edge of the top workpiece within a cassette to discharge the workpiece from the cassette. In the context of the present invention, although the term "fluid" refers to a liquid in the preferred embodiment, it will be understood that the term "fluid" may also refer to a gas for those applications of machine 100 in which a gas is used to eject the wafers, for example when it is not necessary to maintain the workpieces in the wetted condition.

With continued reference to FIG. 3, workpiece discharge assembly 134 is suitably configured to facilitate virtually any desired orientation of nozzle 136 with respect to the workpiece to be discharged.

More particularly, discharge assembly 134 further comprises a back plate 138, respective side plates 140, 142, a bottom plate 143, and a front plate 144. As best seen in FIG. 3, back plate 138 is suitably configured to slide up and down (along the Z axis) through a slotted engagement mechanism 146 with side plate 140. A Z axis control assembly 148 suitably secures the vertical position of back plate 138 with respect to discharge assembly 132. In this way, the vertical position of nozzle 136 with respect to the uppermost workpiece in the cassette may be adjusted and maintained. For this purpose, Z axis control assembly 148 suitably comprises a screw 149 to secure the Z position of nozzle 136.

With continued reference to FIG. 3, the X axis position of nozzle 136 may be adjusted and maintained by sliding a nozzle support block 150 along the X axis within a rectangular relief 152 formed in rear plate 138. The X position of block 150 (and hence the X position of nozzle 136) may be maintained by securing a pair of screws (not shown) within respective oval adjustment recesses 154 of block 150.

With continued reference to FIG. 3, the position of nozzle 136 with respect to the workpiece to be discharged may be further adjusted by tilting the Z axis by manipulating respective tilt screws 156. In this way, back plate 138, corresponding to the Z-X plane, may be tilted about the X axis, as desired. Finally, a radial adjustment mechanism 158 may be manipulated to effectively rotate nozzle 136 about the Z axis.

By adjusting the position of nozzle 136 with respect to the workpiece to be discharged in accordance with the aforementioned adjustment mechanisms, optimum placement of nozzle 136 with respect to the workpiece may be achieved. With continued reference to FIG. 3, front plate 144 of discharge assembly 134 suitably comprises a wafer discharge outlet 160 through which workpieces are discharged from discharge assembly 134 and into water track 116, as described in greater detail below. As further described below, front panel 144 is suitably secured to water track assembly 116 through respective water track mounts 162.

With continued reference to FIGS. 1 and 3, it will be appreciated that elevator assembly 128 is suitably configured to raise platform 124 (and hence cassette 126) upwardly along the Z axis in step-wise fashion within tank 132 to thereby properly position the uppermost wafer within cassette 126 adjacent nozzle 136 so that the fluid discharged from nozzle 136 sequentially urges the then uppermost workpiece through wafer outlet passage 160 and into water track 116, as described in greater detail below.

Figure 4:
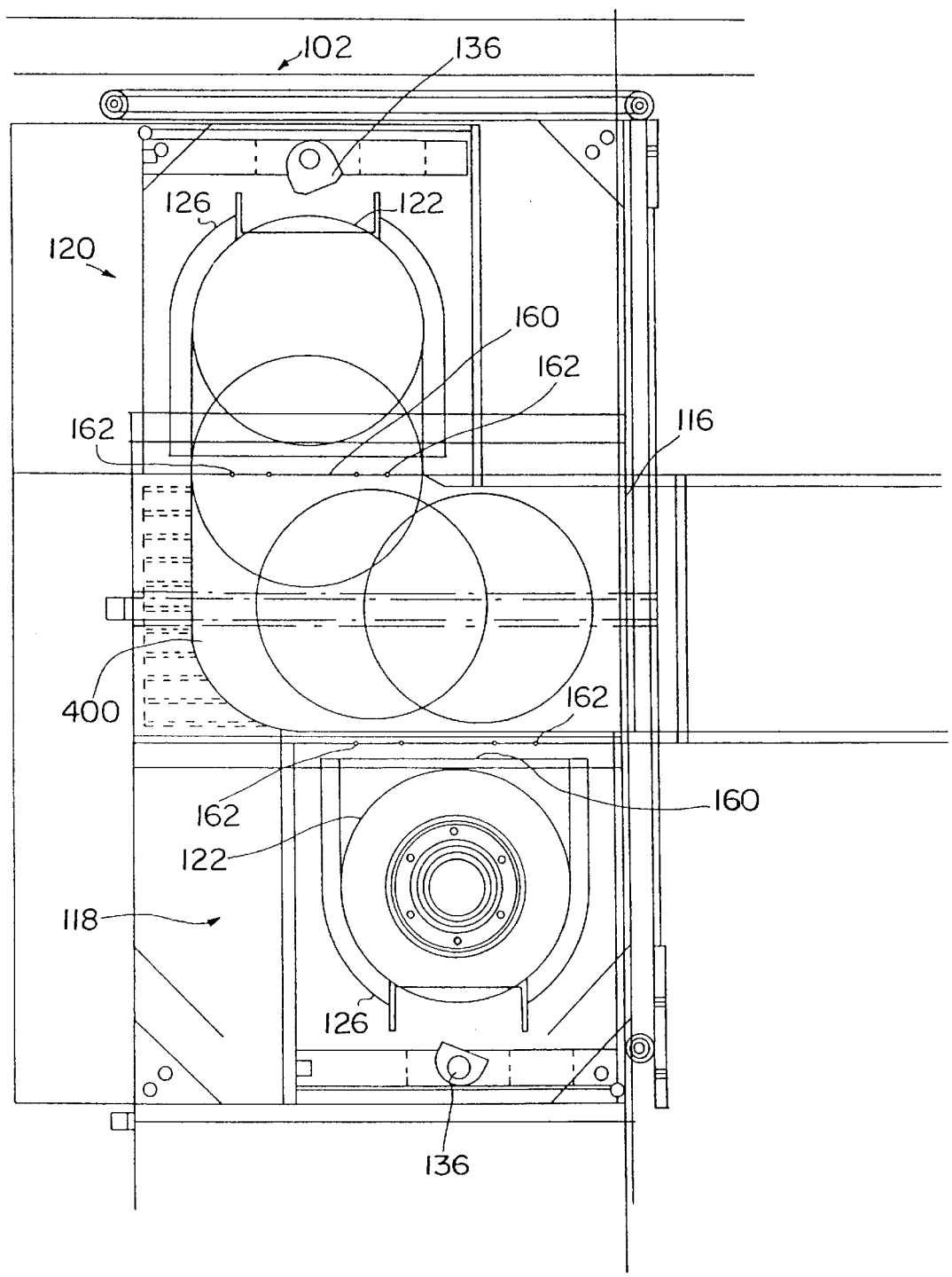
FIG. 4 is a top plan view of the workpiece load station of FIG. 2, showing the path traveled by workpieces being discharged from one of the cassettes into the water track.

Referring now to FIGS. 1, 2 and 4, water track 116 suitably comprises an input module 400 configured to receive workpieces discharged from respective loading assemblies 118 and 120, and to guide the workpieces in a non-contacting fashion down water track 116 (to the right in FIG. 4).

As best seen in FIG. 4, in accordance with a preferred exemplary embodiment of the present invention, workpiece load station 102 suitably comprises a modified "T" configuration, wherein each of respective cassette assemblies 118, 120 are substantially orthogonal to the path of water track 116, yet offset from one another by a sufficient amount to ensure that a wafer discharged from one of the cassettes will not inadvertently contact the oppositely disposed cassette, for example if the discharge force is mistakenly set too high. As briefly discussed above, it will be appreciated that virtually any dual or plural cassette input configuration may be employed, for example a "Y" configuration, as desired. In this regard, it may be desirable to incorporate three or more cassette assemblies, using a fluid manifold to direct the workpieces discharged from the respective cassette assemblies onto water track 116.

Figure 5:
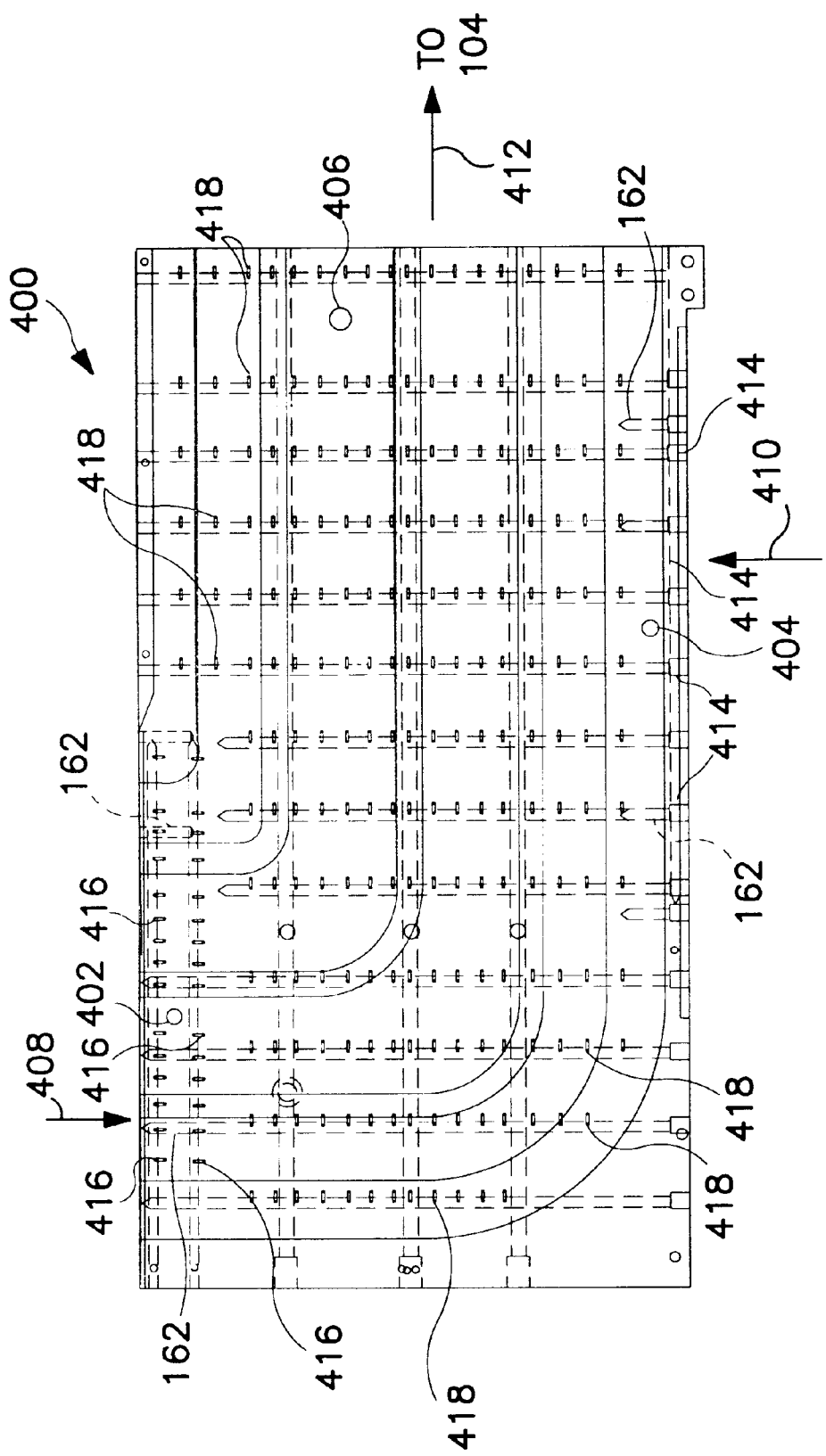
FIG. 5 is a detailed top plan view of an exemplary input manifold for receiving workpieces from two inputs and urging the workpieces along the water track.
Figure 6:
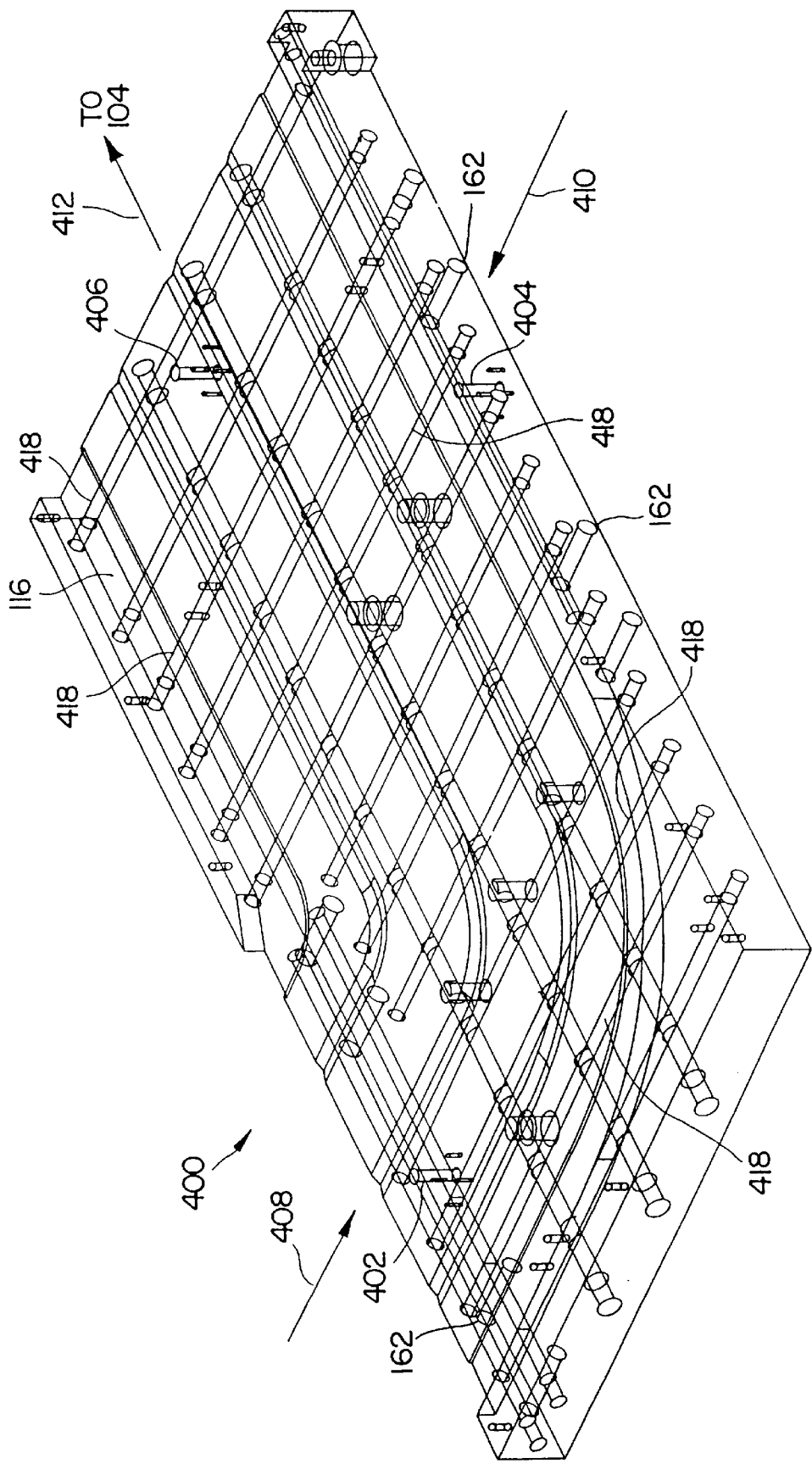
FIG. 6 is a perspective schematic view of the input module shown in FIG. 5 in accordance with a preferred exemplary embodiment of the present invention.

Referring now to FIGS. 4–6, input module 400 is suitably configured to receive workpieces discharged from cassette assembly 120 along arrow 408, and to receive workpieces discharged from cassette assembly 118 along arrow 410. Upon being received by input module 400, the workpieces are supported by fluid which is projected upwardly from the plane of the track through a plurality of fluid jets, as described in greater detail below, such that mechanical contact between the workpieces and input module 400 is substantially eliminated.

Input module 400 suitably comprises a plurality of pull jets 416 configured to urge workpieces out of cassette assembly 120 along the direction of arrow 408. More particularly, pull jets 416 are suitably oriented to discharge fluid upwardly at an angle with respect to the horizontal plane on the order of 20°–70°, and most preferably about 45°, with the horizontal flow vector oriented along the direction of arrow 408. In this way, workpieces received from cassette assembly 120 are drawn into the fluid manifold comprising the interior portion of input module 400.

Input module 400 further comprises a plurality of pull jets 414, similar to pull jets 416, configured to draw workpieces discharged from cassette assembly 118 into the water track along the direction of arrow 410. After being received by input module 418, the workpieces discharged from cassette loading station 102 are carried along water track 116 along the direction of arrow 412 to cleaning station 104. More particularly, input module 400 further comprises a plurality of rows 418, each comprising a number (e.g., 10–20 and most particularly about 17) of fluid jets configured to urge the workpieces along the direction of arrow 412. The fluid jets comprising rows 418 are also configured to discharge fluid upwardly from water track 116, and are suitably inclined with respect to the horizontal plane, which is substantially defined by work pcs. present upon the water track, at an angle in the range of 20°–70°, and most preferably about 45°. In this way, workpieces received from cassette input station 102 are urged along water track 116 substantially devoid of any mechanical contact.

With continued reference to FIGS. 4–6, a first workpiece detection sensor 402 is suitably disposed proximate workpiece passageway 160 of discharge assembly 120; a similar workpiece detection sensor 404 is suitably disposed proximate outlet path 160 associated with load assembly 118. Respective workpiece sensors 402 and 404 monitor the steady state operation of machine 100, and may be configured to generate an alarm, or to stop the operation of machine 100 in the event the workpiece is detected as being "hung up" or otherwise lodged in the vicinity of the sensor. In addition, the sensors may be employed to count workpieces as they pass by the sensor (or to confirm that no workpieces are present) to thereby confirm that all of the workpieces have been discharged from a cassette.

A workpiece sensor 406 is also suitably disposed within input module 400 proximate the input to cleaning station 102.

Workpiece sensors 402–406 may comprise any suitable mechanism for detecting the presence and/or absence of a workpiece, for example including optical sensors.

Referring now to FIGS. 7A–7E, an exemplary cleaning station 104 in accordance with a preferred embodiment of the present invention suitably comprises a scrubber box enclosing a plurality of pairs of rollers. More particularly, cleaning station 104 suitably comprises a bottom panel 740, a top panel 742, a rear panel 744, and a front panel 738. In accordance with a particularly preferred embodiment, these panels comprise a self-contained box, which can be quickly and easily removed and replaced when it is desired to replace one or more of the rollers. The ability to quickly and conveniently remove and replace rollers and roller boxes in the context of the present invention further facilitates the substantially continuous operation of machine 100.

With continued reference to FIGS. 7A–7E, cleaning station 104 suitably comprises a plurality of roller pairs configured to drive each workpiece through the roller box and to simultaneously clean the top and bottom flat surfaces of each workpiece passing therethrough. More particularly and with particular reference to FIG. 7B, cleaning station 104 suitably comprises on the order of 5–15 pairs of rollers, and most preferably about 9 pairs of rollers. In the illustrated embodiment, the scrubber box includes a first roller pair comprising respective rollers 702 and 704; a second roller pair comprising upper roller 706 and lower roller 708; a third roller pair comprising upper roller 710 and lower roller 712; a fourth pair comprising upper roller 714 and lower roller 716; a fifth pair comprising upper roller 718 and lower roller 720; a sixth pair comprising upper roller 722 and lower roller 724; a seventh pair comprising upper roller 726 and lower roller 728; an eighth pair comprising upper roller 730 and lower roller 732; and a ninth, terminal roller pair comprising upper roller 734 and lower roller 736. As best viewed in FIG. 7B, machine 100 is suitably configured such that workpieces enter roller box 104 from the far left and are sequentially urged through the roller box, being discharged from the roller box at the far right position (rollers 734 and 736).

In accordance with a preferred exemplary embodiment, each of the odd pairs of rollers (e.g., the first, third, fifth, seventh, and ninth roller pairs) function as drive rollers, with each drive roller pair operating at a drive speed S1. As such, rollers 702, 704, 710, 712, 718, 720, 726, 728, 734, and 736 operate at drive speed S1.

Figure 7A:
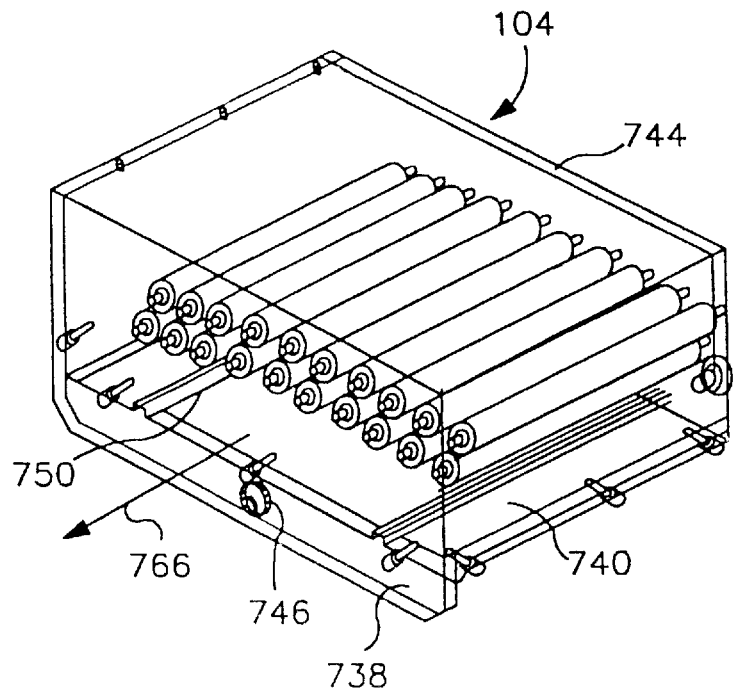
FIG. 7A is a perspective schematic view of an exemplary scrubber box 104, including a plurality of respective pairs of rollers.
Figure 7B:
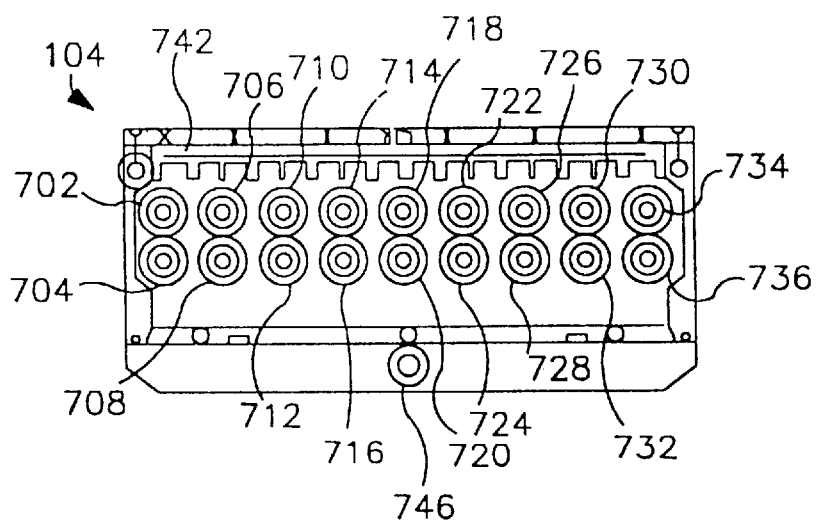
FIG. 7B is a schematic front elevation view of the scrubber box shown in FIG. 7A.
Figure 7D:
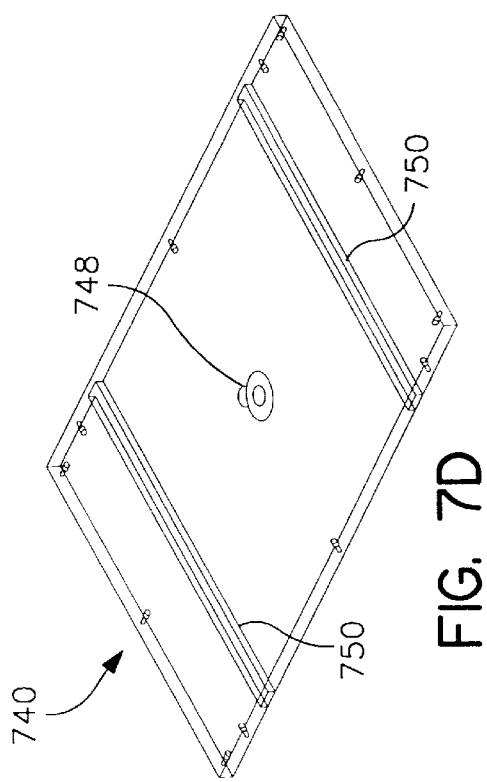
FIG. 7D is a perspective view of the bottom panel of the scrubber box shown in FIG. 7A.

Moreover, each of the bottom rollers (i.e., rollers 704, 708, 712, 716, 720, 724, 728, 732, and 736) rotate clockwise as shown in FIG. 7B. In addition, the top roller of each even roller pair (i.e., rollers 706, 714, 722, and 730) also rotate clockwise from the perspective shown in FIG. 7B. Finally, the top roller in each odd roller pair (i.e., rollers 702, 710, 718, 726, and 734) advantageously rotates counterclockwise.

With continued reference to FIG. 7B, in accordance with a preferred embodiment every even bottom roller (i.e., rollers 708, 716, 724 and 732) is advantageously configured to operate at a second drive speed S2. Finally, every even top roller (i.e., rollers 706, 714, 722 and 730) is advantageously configured to operate at a process speed S3. In addition, the tension between the two rollers comprising each respective roller pair is suitably approximately uniform throughout the roller box.

In accordance with a preferred exemplary embodiment of the present invention, each odd roller pair is suitably driven by a first drive motor so that each odd roller pair (the "drive rollers") drive the workpieces through the cleaning station at an essentially uniform rate. In accordance with a particularly preferred embodiment, every even top roller is suitably driven by a second motor at process speed S3; every even bottom roller are suitably driven by the second motor at second drive speed S2 at a predetermined gear ratio below process speed S3. In this way, the operator may control the drive speed S1 by setting a first control associated with the first motor; the operator may also independently control drive speed S3 by manipulating a second control associated with the second motor. By so doing, the operator also indirectly controls drive speed S2, as drive speed S2 suitably follows drive speed S3 in accordance with the predetermined gear ratio discussed above. By allowing the operator to dynamically configure respective drive speeds S1, S2, and S3, substantial processing flexibility is achieved in cleaning station 104. Moreover, by setting S3 higher than S1, in accordance with a preferred embodiment, the even roller pairs effectively simultaneously clean the top and bottom surfaces of the workpieces as the workpieces are moved through the scrubber box at drive speed S1 by the drive rollers (e.g., the odd roller pairs).

Although the aforementioned roller speeds reflect the best mode of practicing the invention known to the inventors at the time this application was filed, it is to be understood that virtually any number of rollers and any combination of roller speeds and roller directions may be employed in the context of the present invention. For example, two, three, or even more than three different roller speeds may be employed, with various permutations and combinations of speed and direction used by each of the rollers within the roller box to achieve optimum cleaning performance for any desired process.

With continued reference to FIGS. 7A–7E, assembly 104 is advantageously configured for easy installation into and removal from machine 100. More particularly, bottom panel 740 suitably comprises one or more grooves (e.g., dovetail grooves) 750 to permit sliding engagement of assembly 104 to machine 100. For example, machine 100 may advantageously comprise a frame portion having corresponding ridges (not shown) configured to be received within grooves 750 for convenient sliding engagement and alignment of assembly 104 with respect to machine 100. Bottom panel 740 further comprises a fluid outlet 748 through which cleaning fluid may flow out of cleaning station 104, as described in greater detail below. If desired, the fluid retrieved from fluid outlet 748 may be recycled, as desired.

Figure 7E:
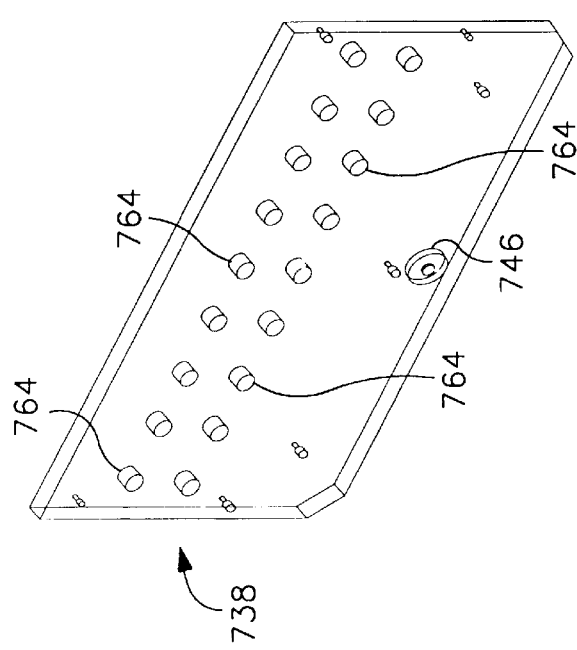
FIG. 7E is a perspective view of the front panel of the scrubber box shown in FIG. 7A.
Figure 7C:
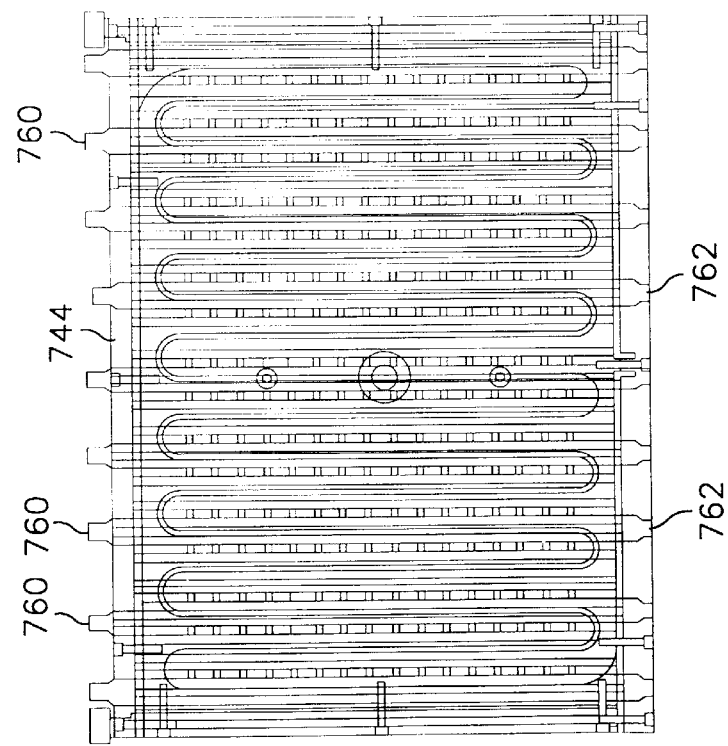
FIG. 7C is a top view of the scrubber box of FIG. 7A.

Referring now to FIGS. 7A, 7C, and 7E, each of respective drive rollers 702–736 comprise a gear end 760 and a follower end 762. In accordance with the illustrated embodiment, each of the respective gear ends 760 are configured to extend through rear panel 744. Each respective follower end 762 is advantageously configured for rotating receipt within respective follower junctions 764 configured in front panel 738. In addition, front panel 738 further comprises a fastener assembly 746 for securing cleaning assembly 104 to the frame (not shown) of machine 100. It will be appreciated that fastener assembly 746 may comprise a screw, bolt, quick release, or any other suitable fastening mechanism for securably but releasably engaging assembly 104 to the frame of machine 100.

With continued reference to FIGS. 7A and 7C, cleaning assembly 104 may be conveniently removed and replaced as follows. Cleaning machine 100 may be placed in the off or hold mode of operation to permit the removal and replacement of cleaning assembly 104. In this condition, fastener assembly 746 is disengaged, for example by unscrewing a screw associated with fastener 746. Box 104 may then be manually removed by the operator by pulling the box, for example along arrow 766 in FIG. 7A. Gear ends 760 of the rollers are suitably passively disengaged from the drive mechanism (not shown) associated with machine 100 as box 104 is slid along arrow 766, guided by grooves 750. Once box 104 is removed, a replacement box prepared by the operator in advance may be inserted in place of the removed box; alternatively, box 104 may be opened and the rollers quickly replaced so that the refurbished cleaning station may be quickly placed back onto machine 100. In either case, cleaning station 104 may be reassembled to cleaning machine 100 by aligning grooves 750 with corresponding ridges associated with the machine, and sliding the box back into the original operating position. Grooves 750 facilitate the alignment of gear ends 760 into the mating drive mechanism (not shown for clarity) associated with machine 100. When cleaning station 104 is reassembled into its operating position, fastener 746 may be reengaged by the operator to secure the cleaning station in place. Of course, any fluid inlet, fluid discharge, or workpiece sensing hardware associated with box 104 may also have to be attended to during removal and reinstallation.

Figure 8:
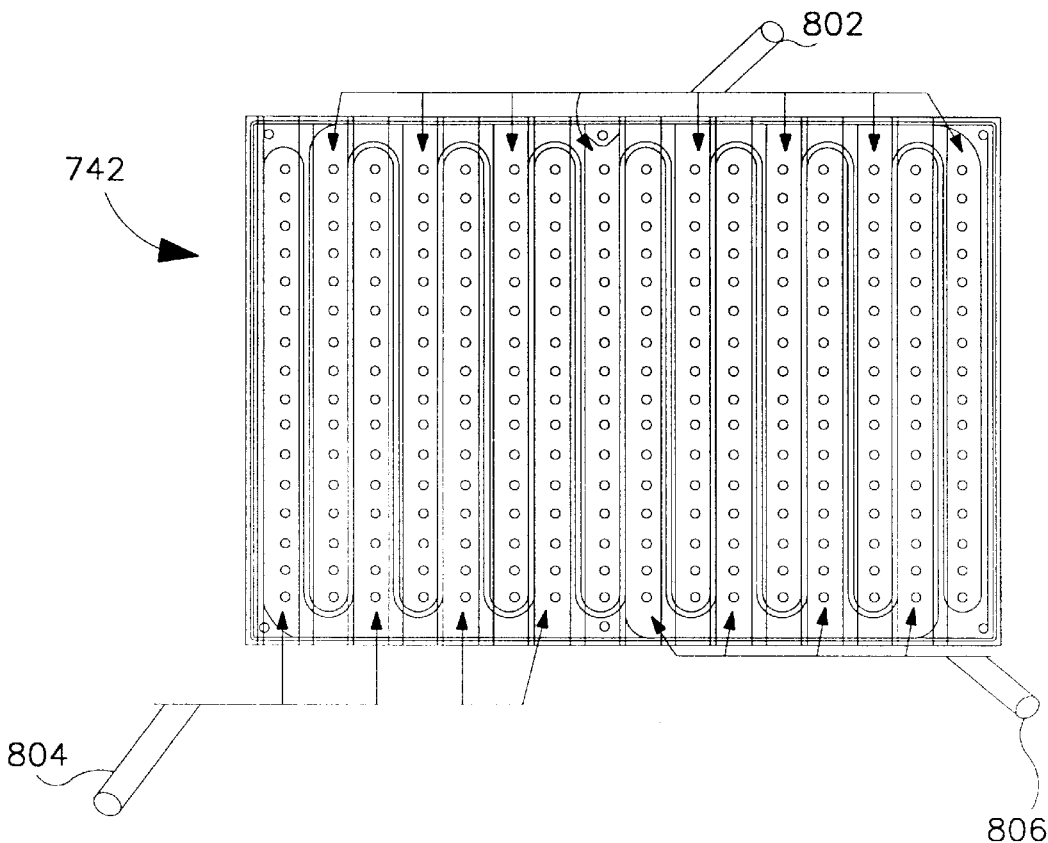
FIG. 8 is a top plan schematic view of the top panel of the roller box shown in FIG. 7.
Figure 9:
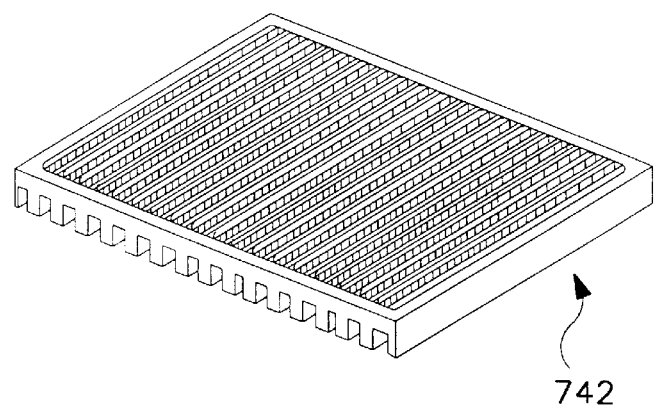
FIG. 9 is a perspective view of the top panel shown in FIG. 8.

Referring now to FIGS. 7B and 8–9, top panel 742 further comprises one or more fluid inlet ports configured to distribute fluid to a discrete portion of or to the entirety of the inside of roller box 104.

More particular, top panel 742 suitably comprises a first fluid inlet port 802 configured to distribute a first fluid throughout the entire roller box. As such, fluid inlet port 802 advantageously communicates with channels disposed to release fluid along the length of or in the vicinity of each of the top rollers. Top panel 742 further comprises a second fluid inlet port 804 similarly configured to distribute a second fluid throughout a first portion of the roller box, for example in the region occupied by the first four roller pairs. Top panel 742 further comprises a third fluid inlet port 806 configured to distribute a third fluid throughout a second region of the roller box, for example a region associated with the last five roller pairs.

Of course, it is to be appreciated that any number of fluid inlet ports may be employed in conjunction with roller box 104, and that the fluid inlet ports may communicate with any desired portion of the roller box, with or without overlap, as desired to optimize particular processing applications.

Figure 15A:
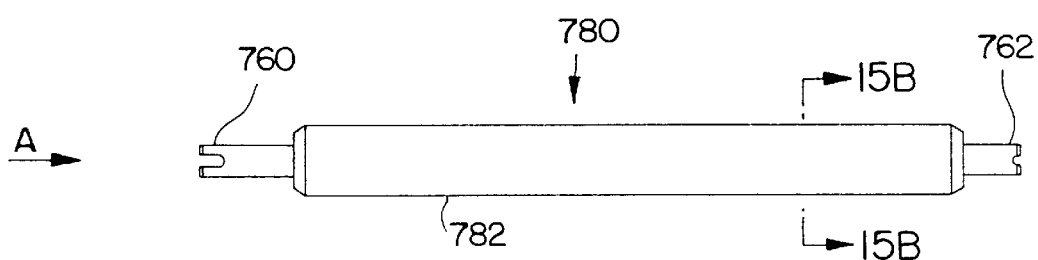
FIG. 15A is a top plan view of an exemplary roller bar useful in the context of the roller box shown in FIG. 7.
Figure 15B:
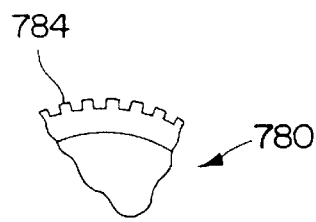
FIG. 15B is a cross-section view of the shaft portion of the roller bar shown in FIG. 15A.

Referring now to FIGS. 7B and 15A–B, each of the rollers within roller box 104 suitably comprises a roller carrier 780, comprising a gear end 760, a follower end 762, and an elongated shaft 782. As shown in cross-section in FIG. 15B, shaft 782 suitably comprises peripheral structures 784 suitable for engaging a soft, spongy elongated annular ring (not shown) about shaft 782. Although surface structures 784 are illustrated as elongated, parallel geared teeth, virtually any mechanism may be employed which facilitates a strong frictional fit between shaft 782 and the spongy roller material. In this way, slippage between the inner roller body shaft and the outer spongy roller material may be minimized, while at the same time facilitating the easy removal and reinsertion of roller material off of and onto roller bar 780. In this regard, suitable roller material may comprise PVA rollers available from the Meracel Company of New Jersey.

Referring now to FIGS. 1–2 and 10–13, preferred exemplary embodiments of the construction and operation of rinsing station 106 will now be described.

As each workpiece comes out of scrubbing station 104, it is received by rinsing station 106. More particularly, a preferred exemplary embodiment of rinse station 106 suitably comprises a first rinse ring 1002 and a second rinse ring 1004 each mounted to a shuttle arm 1006. In operation, shuttle arm 1006 alternately shifts back and forth from a left position (as shown in FIG. 2) to a right position (as shown in FIG. 11). As a result of the alternating left-to-right shifting operation of shuttle assembly 1006, a workpiece carried by rinse ring 1002 may assume position A (when the shuttle assembly is in the left position shown in FIG. 2) or position B (when the shuttle assembly is in the right position shown in FIG. 11); analogously, the workpiece carried by rinse ring 1004 may assume position B (when the shuttle assembly is in the left position shown in FIG. 2) or position C (when the shuttle assembly is in the right position shown in FIG. 11).

With particular reference to FIGS. 10 and 11, the dual rinse ring assembly of the present invention further facilitates increased workpiece throughput by retrieving a workpiece from scrubber box 104 while a previously retrieved workpiece is being rinsed.

More particularly and referring now to FIGS. 10–13, each respective rinse ring assembly 1002, 1004 suitably comprises a ring body 1008 mounted to shuttle arm 1006. Ring body 1008 suitably comprises a fluid manifold 1010 communicating with respective fluid supply ports 1012A, 1012B, and 1012C. Manifold 1010 is advantageously configured with a plurality of jets 1014 disposed about a substantially horizontal surface 1016 of ring body 1008. Fluid supply ports 1012 supply fluid to the internal region of manifold 1010, such that fluid is ejected from respective jets 1014 at a substantially uniform pressure and flow about the arc defined by surface 1016.

Figure 12A:
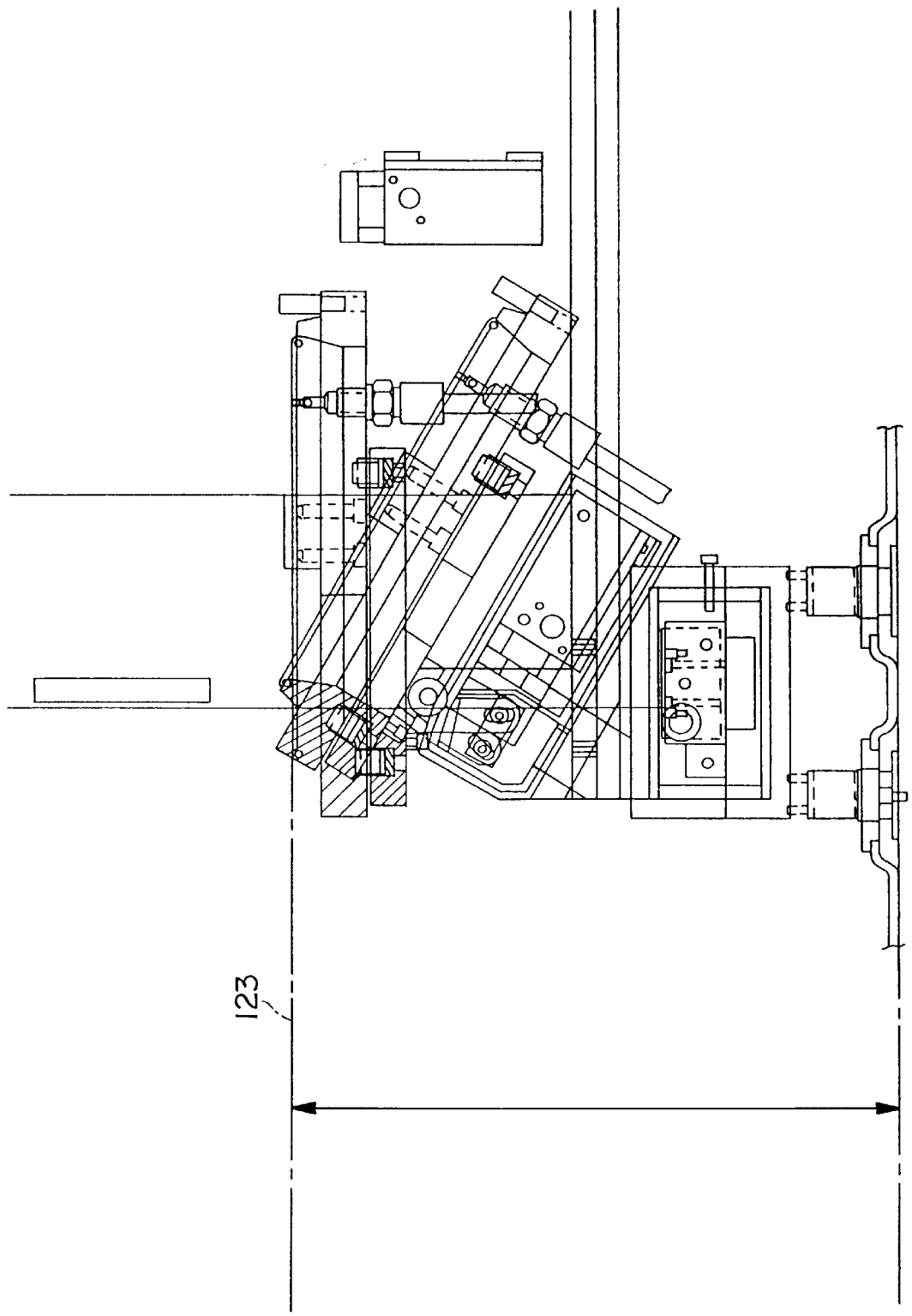
FIG. 12A is a detailed side view of the rinse ring station, shown with one of the rinse rings in the tilted position.
Figure 12B:
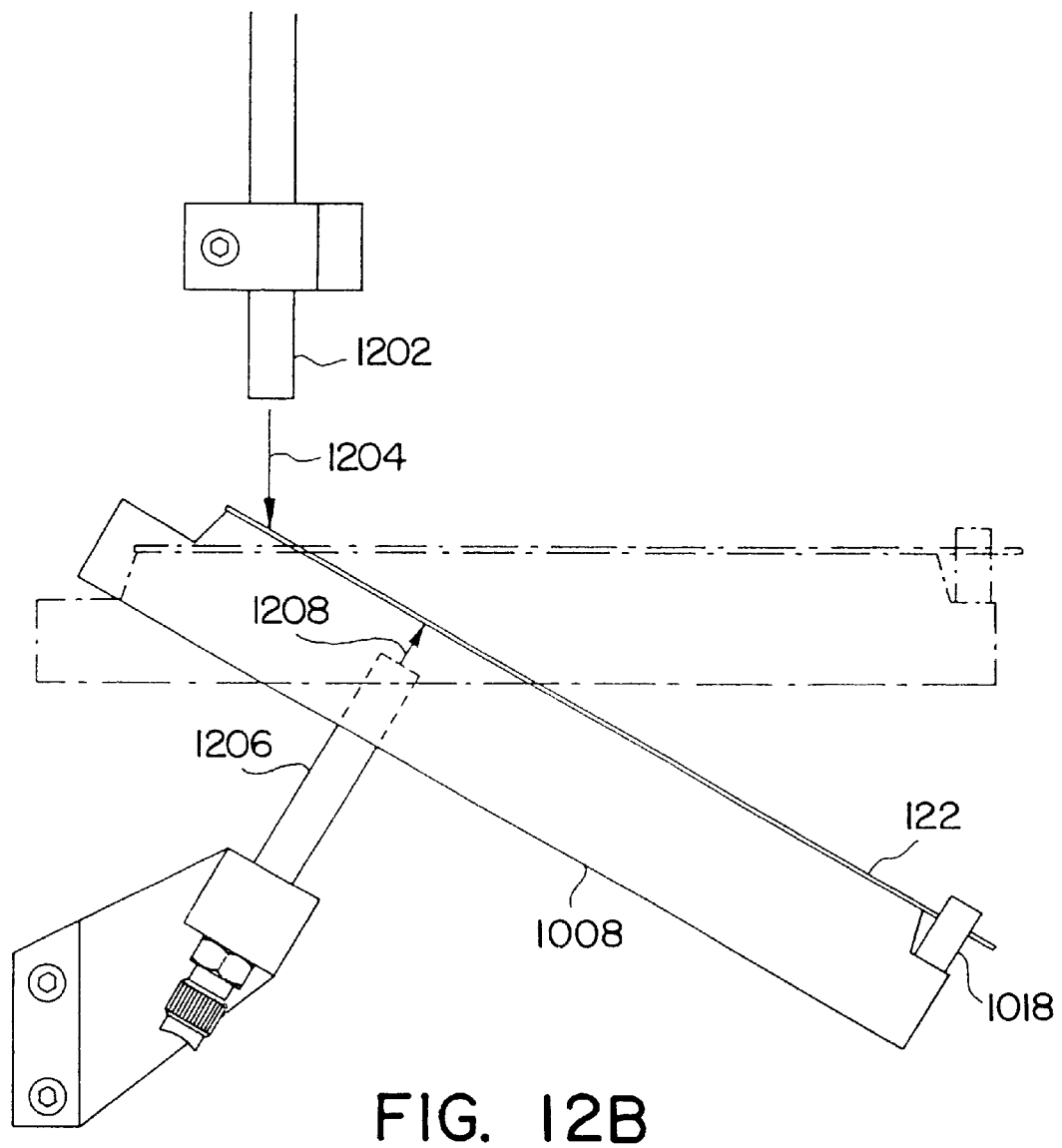
FIG. 12B is a closeup view of the rinse ring station of FIG. 12A, illustrating the rinse fluid flow ports.

With particular reference to FIGS. 10B, 12A and 12B, as a workpiece 122 is discharged from scrubber box 104, the plane of travel of the workpiece is substantially defined by plane 123. As best seen in FIG. 12A, plane 123 is slightly above (e.g., 5–20 mm and preferably about 10 mm) the horizontal surface defined by surface 1016 of ring body 1008. The fluid (not shown) ejected from jets 1014 supports workpiece 122 as the workpiece is transferred from the scrubber box to the rinse ring.

Figure 13:
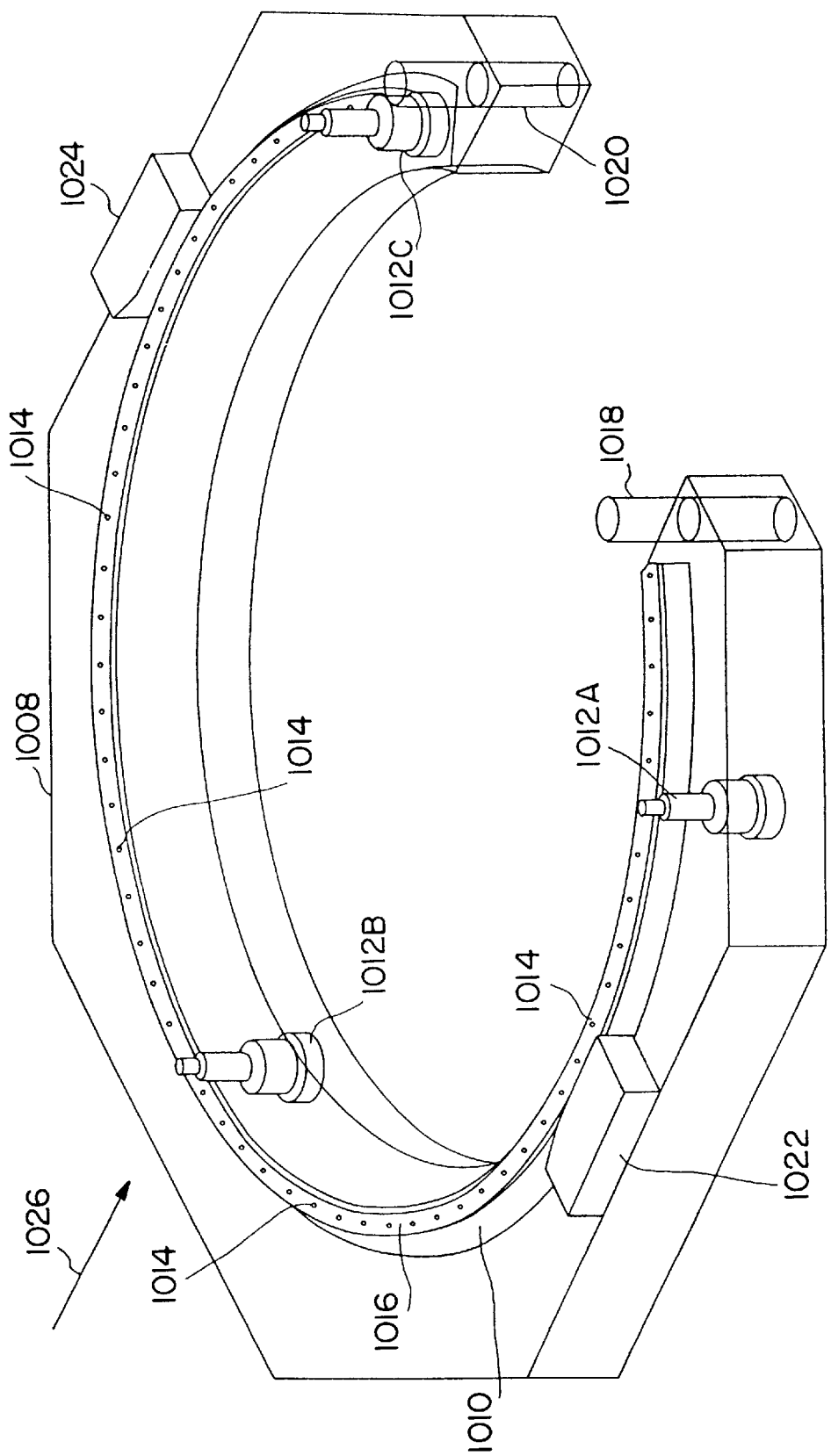
FIG. 13 is a perspective schematic detailed view of an exemplary rinse ring body in accordance with the present invention.

Referring now to FIGS. 11 and 13, the workpiece is substantially centered about manifold 1010 through the interaction of respective wafer guides 1022, 1024 and respective centering pins 1018, 1020 as each workpiece is transferred from scrubber box 104 to the rinse ring along arrow 1026. Although the perimeter edge of each workpiece may gently contact wafer guides 1022, 1024 and/or one or both centering pins 1018, 1020, the mechanical contact between the flat workpiece surfaces and rinse ring body 1008 is substantially avoided.

With particular reference to FIGS. 10B and 12A, when a workpiece is substantially centered within the rinse ring and supported by the supporting fluid ejected from jets 1014 (FIG. 13), the workpiece is said to be completely transferred from scrubber station 104 and received within the rinse station. At that point, shuttle assembly 1006 (FIG. 11) shuttles to the next position so that the other rinse ring can receive a workpiece from the scrubber station. Upon shuttling from the right position to the left position (or vice versa), rinse ring 1002 (or alternatively, rinse ring 1004) is caused to tilt downwardly as shown in FIGS. 10B and 12A, deviating from the horizontal plane by an angle in the range of 10°–50°, and most preferably about 30°. In this position, rinsing fluid is supplied to both the upper surface and bottom surface of the workpiece. More particularly and with momentary reference to FIG. 12B, a first fluid nozzle 1202 is suitably configured to discharge rinse fluid at the upper surface of the workpiece, substantially along arrow 1204. A second rinse nozzle 1206 is suitably configured to discharge rinse fluid at the bottom surface of the workpiece, substantially along arrow 1208.

In accordance with a particularly preferred embodiment of the present invention, throughput may be increased by simultaneously rinsing both the upper and lower surfaces of each workpiece. Moreover, by orienting upper surface rinse fluid supply port 1202 with respect to the upper surface of the workpiece as shown in FIG. 12B, the perimeter edge of the workpiece may also be effectively rinsed. In a preferred embodiment, rinse fluid is applied to the top surface at a rate in the range of 0.1–20 liters/minute, and most preferably about 4–5 liters/minute; similarly, rinse fluid is advantageously applied to the bottom surface at a rate in the range of 0.1–10 liters/minute, and most preferably about 1.5 liters/minute.

Upon completion of the rinsing operation, the then tilted rinse ring assembly is manipulated back to the horizontal position, whereupon first transfer station 108 retrieves the rinsed workpiece and transfers the workpiece to spin-dry station 110; alternatively, first transfer station 108 may suitably retrieve the rinsed workpiece from the rinse ring while the rinse ring is in the tilted position.

Referring again to FIGS. 1 and 2, first transfer station 108 suitably comprises a robotic arm 109 configured to retrieve a rinsed workpiece from rinse ring 1004 and transfer the workpiece to a spin-dry assembly 111. A similar robotic assembly (not shown) is disposed within transfer station 108, and configured to retrieve a rinsed workpiece from rinse ring 1002 (when rinse ring 1002 is in position A as shown in FIG. 2) and transfer the workpiece to spin-dry assembly 113. The use of dual rinse rings, transfer assemblies, and spin-dry stations in accordance with the present invention further facilitates increased workpiece throughput through machine 100.

Figure 16:
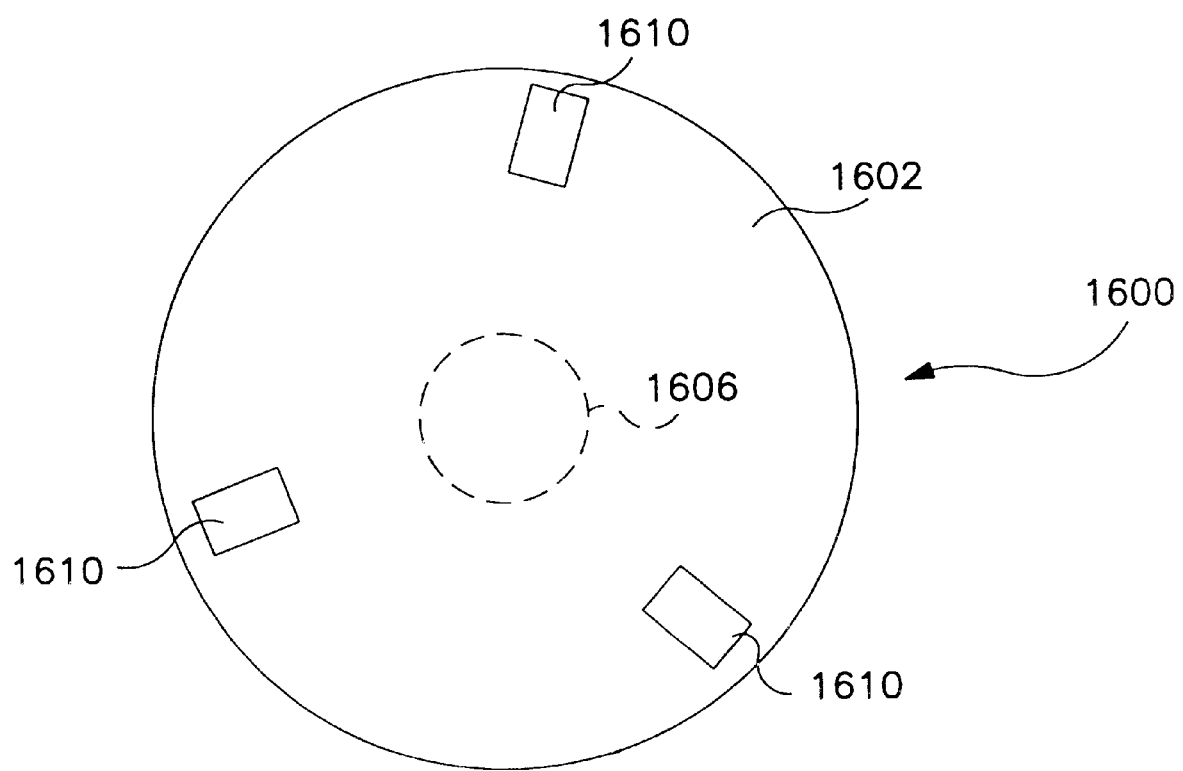
FIG. 16 is a perspective view of an exemplary spin support platform.

The construction and operation of a preferred exemplary embodiment of respective spin-dry assemblies 111 and 113 will now be described in connection with FIGS. 16–18.

Each spin-dry assembly in accordance with the present invention suitably comprises a spin platform 1600 configured to hold the workpiece as it is spin dried. More particularly, platform 1600 suitably comprises a flat upper surface 1602 having a plurality (e.g. 3) of slots 1610 which extend through disk shaped platform 1600. The under surface of platforms 1600 suitably comprises a hub 1606 having a cylindrical cavity 1604 for receiving a drive shaft (not shown); the drive shaft is suitably connected to a spinner motor, discussed below, for rotating support platform 1600. A bob 1800 is suitably disposed within each slot 1610 and configured to clamp a workpiece during the rotation of spin platform 1600, as described in greater detail below.

Each bob 1800 suitably comprises an upper body portion 1802, a lower body portion 1804, a pivot arm 1810, a wafer clamp 1806, a button 1808, and a spring seat 1812. Each bob 1800 is suitably pivotably secured within each respective slot 1610 through any convenient mechanism, for example by extending pivot bar 1810 through corresponding pivot supports (not shown) in platform 1600.

During the operation of spin platform 1600, i.e., when spin platform 1600 is spinning, workpiece 122 is suitably clamped by respective bobs 1800. More particularly, a suitable spring 1608 is configured to bias bob 1800 such that wafer clamp 1806 is urged upwardly; in so doing, each wafer clamp is also urged inwardly, securely holding workpiece 122 in place as shown in FIG. 17. When it is desired to unload a dried workpiece from the spin platform and to load a new, recently rinsed workpiece on to the empty spin platform, a respective button actuator assembly 1704 associated with spin-dry assembly 110 and disposed proximate each of the bobs is configured to extend upwardly along arrow 1702 and contact the under surface of bob 1800, generally as indicated by arrow 1702. As a result, the spring force exerted by spring 1608 is counteracted, such that each wafer clamp 1806 associated with each bob is urged radially outwardly allowing workpiece 122 to drop downwardly, supported only by respective buttons 1808. In this regard, each respective button is suitably made from a soft, resilient material which will not damage the under surface of the workpiece. With the wafer clamps in this retracted position, transfer mechanism 112 retrieves the workpiece and transfers it to unload station 114. First transfer station 108 then retrieves a recently rinsed workpiece from rinse station 106 and transfers the workpiece to spin platform 1600.

More particularly, with respective wafer clamps 1806 in their retracted, unclamped positions, first transfer station 108 places a workpiece on spin platform 1600 supported only by respective buttons 1808. In this unclamped position, spin platform 1600, driven by the drive motor (not shown) discussed below, begins spinning at relatively low rpms (e.g. in the range of 500 rpm). Once a desired clamping spin speed is achieved, respective biasing mechanisms 1704 are moved downwardly, such that each respective spring 1608 causes each bob 1800 to pivot about pivot bar 1810, such that the respective wafer clamps 1806 are urged radially inwardly, thereby clamping the workpiece. In this regard, the beveled configuration of respective clamps 1806 permit the clamps to lift the workpiece off of the buttons slightly, suitably to preclude contact between the workpiece and the buttons during the spinning operation.

Figure 17:
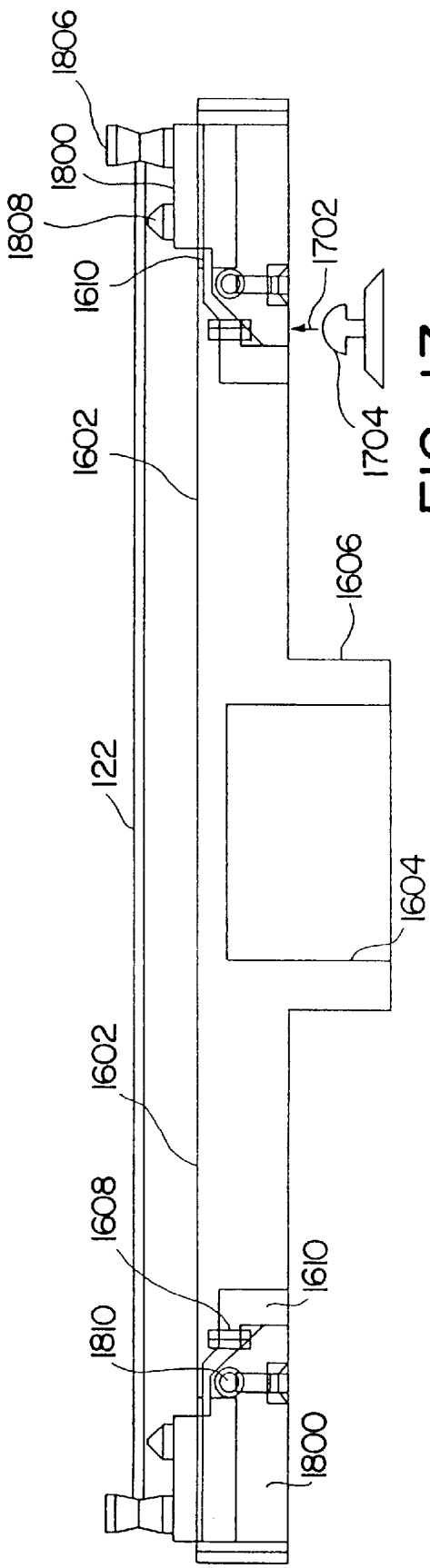
FIG. 17 is a side elevation view of an exemplary spin platform, with a bob shown attached to the distal end of each arm of the spin platform.
Figure 18:
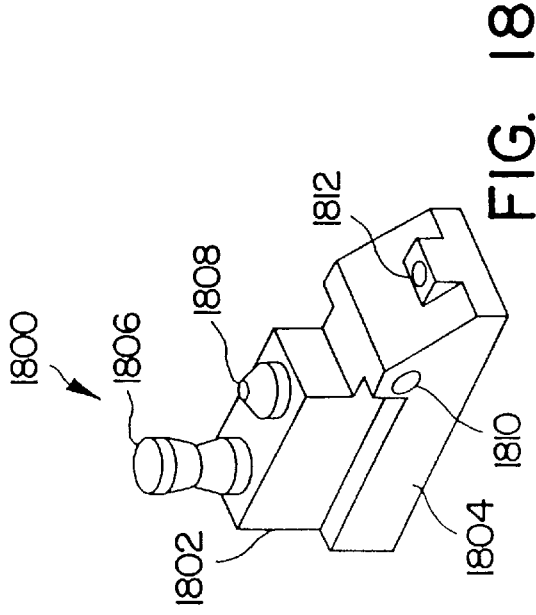
FIG. 18 is a perspective close-up view of an exemplary spinner bob in accordance with a preferred embodiment of the present invention.

With continued reference to FIG. 17, respective button actuators 1704 may be urged upwardly and downwardly through any desired mechanism, for example pneumatically.

With momentary reference to FIG. 2, each of respective spin-dry assemblies 111, 113 are suitably enclosable within a spin-dry chamber 1820. More particularly, a first door 1822 and a second door 1824 may be suitably configured to open (e.g., by extending vertically upwardly, vertically downwardly, or in any convenient manner) to permit the robotic arm associated with first transfer station 108 to transfer a workpiece from the rinse station onto the spin-dry platform. Analogously, a second door 1824 may be configured to open to permit second transfer station 112 to transfer a dried workpiece, after spin-drying, from the spin-dry platform to unload station 114. However, during the spin-dry operation, i.e., when the recently rinsed workpiece is spun at high speed to remove water from the surfaces of the workpiece, respective doors 1822 and 1824 are advantageously closed to prevent fluid which is thrown off of or otherwise liberated from the workpiece and the spin-dry assembly from contaminating dry disks within unload station 114. In addition, door 1822 may also be maneuvered to prevent water from rinse station 106 and/or transfer station 108 from entering chamber 1820 once a workpiece has been dried.

In accordance with one aspect of the present invention, respective spin-dry assemblies 111 and 113 each include a motor (not shown) configured to rotate the spin platform and the workpiece carried thereby at high speed to thereby remove fluid from the workpiece. In accordance with a particularly preferred embodiment of the present invention, a substantially linear ramp is employed as opposed to the stepwise ramp techniques common in the prior art. For example, although the workpiece may be clamped in the spin assembly at a relatively low rpm (e.g., 200–1,000 rpm and most preferably about 500 rpm), the entire acceleration ramp is substantially linear from zero to the top operating speed. In a preferred embodiment, the spinning assembly is accelerated to in the range of 3,000–5,000 rpm, and most preferably about 4,000 rpm. Thus, in accordance with a particularly preferred embodiment, a substantially linear ramp is employed from approximately the rest position to 4,000 rpm.

In accordance with a further aspect of the present invention, the spin assembly is ramped from the point at which the workpiece is clamped to the spin platform (e.g., 500 rpm) to approximately 4,000 rpm in a range of 4–30 seconds, and most preferably about 6–8 seconds. Once top speed (e.g., 4,000 rpm) is achieved, it is maintained for in the range of 4–20 seconds, and most preferably about 10 seconds. Thereafter, a substantially linear ramp is employed to decelerate the spin assembly. In a preferred embodiment, deceleration is effected in approximately 4–30 seconds, and most preferably about 6–8 seconds.

In accordance with an alternate embodiment, the spin-dry assembly is suitably accelerated from the rest position to approximately the clamping speed at a first acceleration, for example in the range of 20–1,000 rpm/sec/sec, and most preferably about 250–300 rpm/second/second. In the alternate embodiment, this original acceleration up to clamping speed suitably occurs in the range of 0.5–5 seconds, and most preferably in the range of about 1–2 seconds. Thereafter, once the workpiece is clamped by the spin assembly, the assembly accelerates from clamping speed (e.g. 500 rpm) to top speed (e.g. 4,000 rpm) at a substantially linear (but suitably higher) acceleration. For example, the spin assembly may be accelerated from 500–4,000 rpm in the range of 0.5–10 seconds and most preferably in the range of about 1–2 seconds.

In accordance with a further aspect of the present invention, harmonics and resonant frequencies are substantially isolated from the workpiece to thereby minimize the possibility of workpiece breakage in the following manner.

The present inventors have determined that spin assembly performance can be greatly enhanced through the careful selection of an appropriate spinner motor. In a preferred embodiment of the present invention, a model number ASM 121 brushless servo motor, available from Berkeley Process Control, Inc. of Richmond, Calif., or a functionally equivalent motor may suitably be employed as the spinner motor. In accordance with one aspect of the present invention, the spinner motor comprises a self-tuning feature whereby the motor may be configured to automatically tune itself to optimize its performance within the anticipated operating environment within machine 100.

More particularly, the motor associated with each spin-dry assembly 111 and 113 may be pretuned by placing a sample workpiece in the spin-dry assembly, and placing the motor (not shown) in the auto-tune or self-tuning mode of operation. This is preferably done while machine 100 is fully operational, thereby optimally simulating the operating environment. The spin-dry assembly is then ramped-up in accordance with normal operating process parameters, and the motor is allowed to tune itself to the operating environment. In this regard, self-tuning motors generally define an operational profile within which the motor optimally operates in an intended operating environment by adjusting various parameters including current, frequency, torque, and the like. In so doing, harmonics and resonant frequencies which may otherwise be contributed to the spin-dry system by the motor are substantially eliminated.

In addition, many self-tuning motors have the capacity to store internally a range of operating parameters (i.e., the motor's optimum operating profile) for an intended environment. In accordance with a further aspect of the present invention, an output signal from the motor is suitably applied to the processor system associated with machine 100, so that as long as the motor operates within its predetermined, pretuned operating parameters, operation of the spin-dry station remains uninterrupted. However, if the motor detects that it is approaching or operating outside of its predetermined profile (i.e., its pretuned range of operating parameters), machine 100 is suitably configured to receive an out-of-tune signal from the motor and display it to the operator. Upon receipt of an out-of-profile signal from the spinner motor, machine 100 may be configured to automatically cease operation; alternatively, the operator may suitably stop the machine and retune the spinner motor by placing the spinner motor back in its self-tune mode of operation and retuning the motor. In this way, damaged and broken workpieces as a result of the poor performance of the spinner motor may be substantially eliminated.

Referring again to FIGS. 1 and 2, second transfer assembly 112 is suitably configured to alternatively retrieve dried workpieces from respective spin-dry assemblies 111 and 113. In particular, second transfer assembly 112 suitably comprises an extendable, rotatable robotic arm 115 configured to grasp workpieces from each spin-dry assembly and load the workpieces into unload station 114.

More particularly and with continued reference to FIGS. 1 and 2, unload station 114 suitably comprises a first unload cassette assembly 117 and a second unload cassette assembly 119. In a preferred embodiment, transfer assembly 112 alternately retrieves dry workpieces from both spin-dry assemblies 111 and 113, and sequentially loads the workpieces into the cassette associated with unload assembly 119 until the cassette is filled. In this regard, a cassette full sensor (not shown) may be disposed within or proximate cassette unload assembly 119 to indicate that the cassette associated with assembly 119 is filled with dry workpieces. Once the cassette associated with assembly 119 is completely filled as indicated by the cassette full sensor, transfer station 112 continues retrieving dry workpieces from respective spin assemblies 111 and 113, and begins loading them into the cassette associated with unload cassette assembly 117.

While cassette assembly 117 is being filled with dry wafers, the full cassette from assembly 119 may be removed (either manually or automatically) and replaced with an empty cassette. In this way, the unloading of dry cassettes from machine 100 may be accomplished in a substantially continuous, uninterrupted manner as desired.

In accordance with a further aspect of the present invention, as variously described above, during the operation of the machine 100 various fluids need to be supplied to the rinse rings (to both support the workpiece and rinse the workpiece), the water track, and to the roller box. Moreover, a plurality of different fluids (e.g., 3) may need to be supplied to the scrub box during the cleaning operation. In accordance with a further aspect of the present invention, machine 100 is suitably configured such that a desired volume rate of flow is supplied to these various operations, which flow rate is substantially unaffected by changes in fluid supply pressure, as described below.

Figure 14:
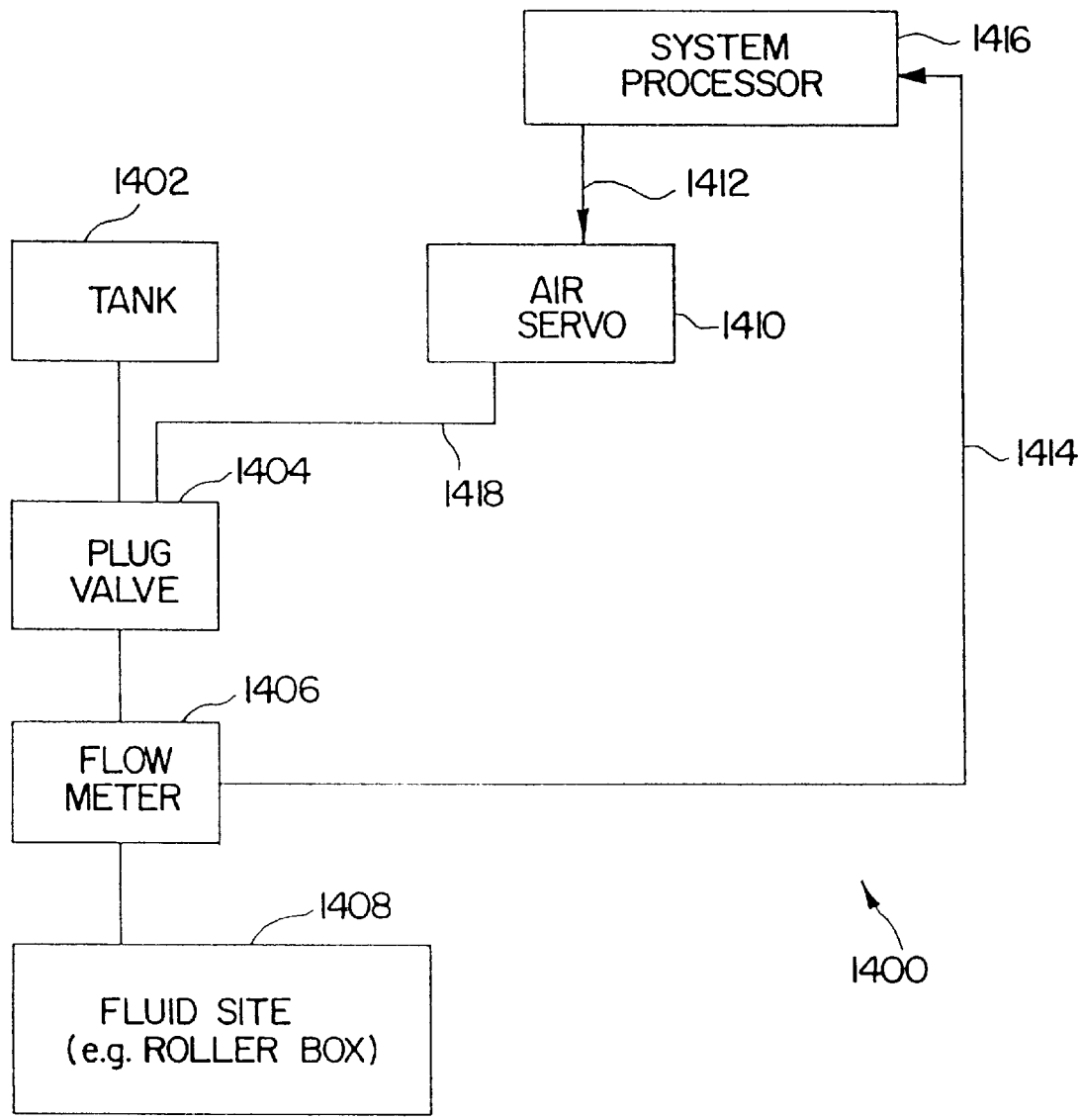
FIG. 14 is a block diagram of an exemplary fluid flow control system used in accordance with the present invention.

Referring now to FIG. 14, an exemplary fluid control scheme in accordance with one aspect of the present invention is illustrated. In particular, an exemplary fluid site 1408 may comprise a rinse ring, a fluid inlet port in cleaning station 104, or a workpiece rinse supply port, for example. Through the operation of the process controller (or one of several process controllers) 1416 associated with machine 100, the volume rate of fluid flow to fluid site 1408 may be accurately controlled notwithstanding the presence of variations in the fluid supply pressure.

With continued reference to FIG. 14, an exemplary hydraulic control scheme 1400 suitably comprises a tank 1402 for holding a supply of a desired processing fluid, a flow meter 1406 having a variable orifice size, a plug valve 1404 for controlling the orifice size of flow meter 1406, and an air servo 1410 for providing an analogue air signal to plug valve 1404, and a processor 1416. In accordance with one embodiment of the present invention, a suitable air servo may comprise a model number QB2T1300 manufactured by Proportion-Air of McCordsville, Ind. under U.S. Pat. No. 4,901,758. In a preferred embodiment, servo valve 1410 suitably comprises a single loop model having internal valves, manifold, internal pressure transducer and electronic controls configured to output an air pressure proportional to an input electrical signal. In the illustrated embodiment, electrical signal 1412 from processor 1416 suitably controls the output of servo 1410.

Also in accordance with a preferred embodiment of the present invention, flow meter 1406 may suitably comprise a rotory wheel flow meter/switch, for example, a model number M-10000T, M10000TM-200T, or the like available from the Malema Engineering Corporation.

With continued reference to FIG. 14, a desired flow rate through flow meter 1406 to fluid site 1408 is suitably programmed into processor 1416 prior to (or during) operation of machine 100. During operation, flow meter 1406 outputs an electrical signal 1414 indicative of the actual flow rate through flow meter 1406 to site 1408. Processor 1416 receives electrical signal 1414 and, responding thereto, adjusts the orifice size associated with flow meter 1406 as necessary to maintain the actual flow rate within a predetermined range from the desired set point flow rate.

More particularly, if the actual flow rate from flow meter 1406, as indicated by signal 1414, deviates from the set point by more than a predetermined error band, processor 1416 outputs an electrical signal 1412 to servo 1410 to thereby change the analogue air pressure signal 1418 output by air servo 1410 and applied to plug valve 1404. In response to analogue air signal 1418, plug valve 1404 changes the orifice size associated with flow meter 1406 in an amount necessary to drive the error between the actual flow rate and the desired flow rate through flow meter 1406 to a minimum. In accordance with a particularly preferred embodiment, a real time, closed loop PID control scheme is employed by processor 1416 to effect this function.

In accordance with an alternate embodiment of the present invention, air servo 1410 and plug valve 1404 could simply be eliminated, such that a direct actuation device may be employed to vary the orifice size of flow meter 1406. In this regard, any suitable torque motor, stepper motor, servo motor, or the like could be employed to directly control the orifice site associated with the flow meter.

In accordance with a further aspect of the present invention, wafer cleaning machine 100 may be advantageously configured in a substantially modular configuration to facilitate the convenient maintenance, repair, troubleshooting, adaptation, and extension of the machine.

Figure 19:
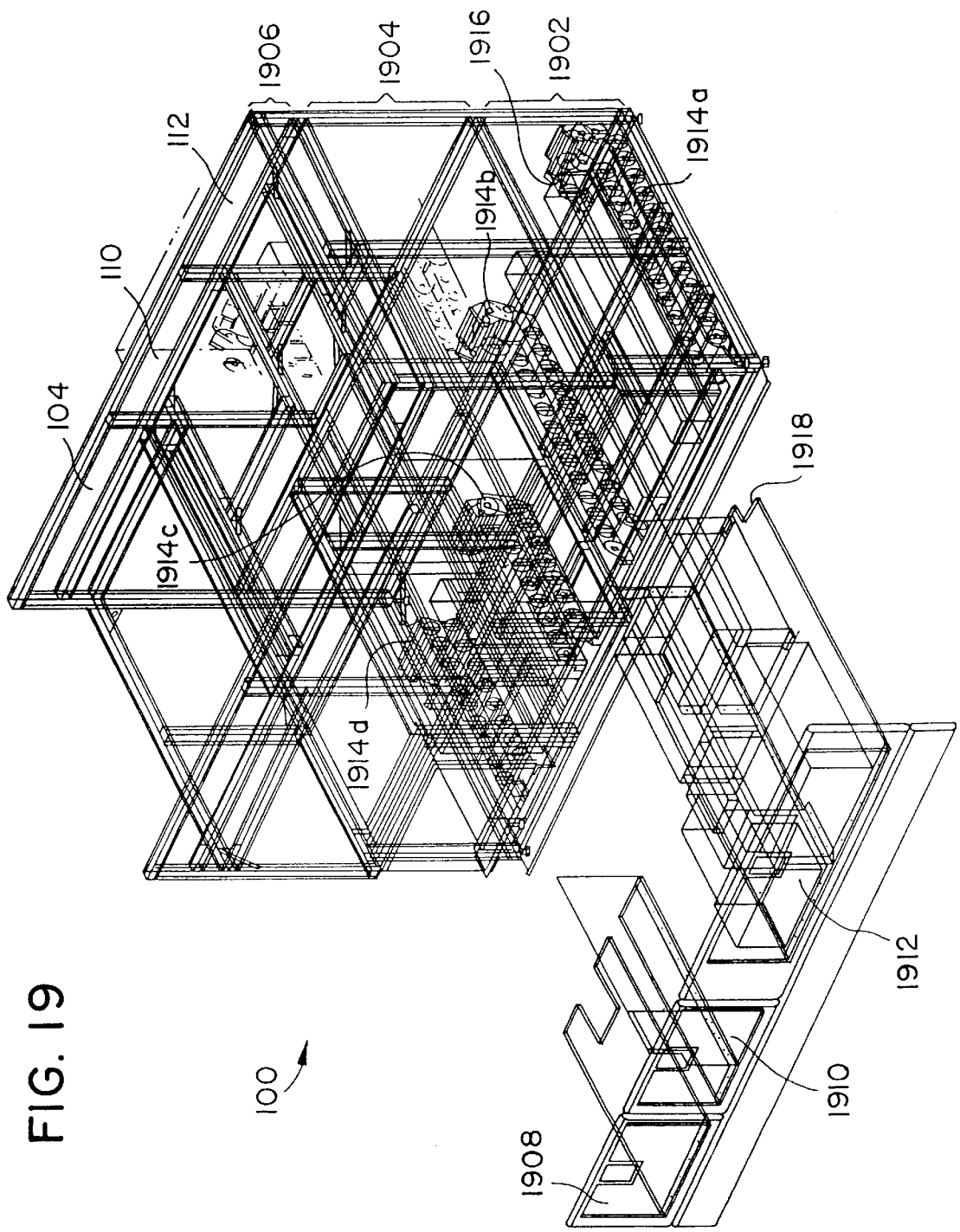
FIG. 19 is a perspective, schematic, partially exploded view of the machine shown in FIG. 1, illustrating various functionally-related compartments.

More particularly and referring to FIG. 19, in a preferred embodiment machine 100 suitably comprises a first control tier 1902, a second maintenance tier 1904, and a third process plane tier 1906. Top tier 1906 suitably corresponds to the workpiece processes described above, and advantageously comprises the various spin assemblies, rinse assemblies, scrubber box, and the like, as well as the various motors and actuators associated therewith. Maintenance tier 1904 suitably comprises a plurality of access panels (not shown for clarity) to permit convenient access to various daily and weekly maintenance items, including air filters, fluid filters, and the like. Control tier 1902 suitably houses various features relating to control functions, advantageously organized in discreet compartments each comprising functionally related hardware and related fixtures.

More particularly and with continued reference FIG. 19, tier 1902 further comprises a plurality of drawers which permit the operator to access various control functionality. In particular, a first drawer 1908 suitably houses a fluid compartment comprising fluid control valves and the like. A second drawer 1910 suitably houses a pneumatics compartment, comprising vacuum lines, pneumatic control valves and the like. A third drawer 1912 suitably comprises the control functionality relating to the electronics of the machine, including input-output ports and a distributed processor, for example one available from Berkly Process Control.

By configuring machine 100 in accordance with the foregoing modular arrangement, maintenance and repair of machine 100 may be greatly simplified. For example, substantially all components which are logically related to one another may be housed in a common compartment, so that for example all fluids may be checked and fluid systems modified in a single location. As a further example, substantially all of the electronic controls and processing systems may be accessed at a single location (i.e., drawer 1912).

To further facilitate the convenient maintenance, repair, and extension of machine 100, respective drawers 1908–1912 are suitably slidingly moveable with respect to the frame of machine 100, for example using ball bearing slide mechanisms functionally analogous to those used in file drawers. To facilitate the opening, closing, and removal of the drawers, the various electrical conduits associated with drawer 1912, the pneumatic conduits associated with drawer 1910, and the hydraulic conduits associated with drawer 1908 are suitably encased in respective flexible conduit tracks 1914A–D. In operation, an end 1916 of an exemplary flexible conduit 1914A is suitably attached to the rear portion 1918 of drawer 1912. Thus, as drawer 1912 is opened, flexible conduit 1916 moves along with the drawer. As conduit 1914A slides along with drawer 1912, the various electrical conduits within sleeve 1914A remain stationery and protected from damage by conduit 1914A.

In accordance with a further aspect of the present invention, the modular construction of machine 100 facilitate the extension of the machine to incorporate additional related functionality or even different functionality entirely.

More particularly and referring to now FIG. 2, the various processing stations (e.g., wafer loading station 102, scrubber station 104) may be contained within separate subframe structures which together comprise the frame associated with machine 100. For example, a frame member 2102 associated with station 102 is shown abutting against a frame member 2104 associated with scrubber station 104. Respective frame members 2102 and 2104 may be secured to one another, for example through bolts or other fasteners, as desired. If it is desired to augment machine 100 to include an additional module, for example an additional scrubber box, an additional cassette assembly, or perhaps a module relating to entirely different functionality (e.g., planarization, lapping, or the like), respective stations 102 and 104 may be separated at the junction 2106 which defines their interface, and an additional functional module inserted therebetween. The newly inserted functional module may also include a first, second, and third tier component which respectively house the processing, maintenance, and control functionality of the additional module, as desired.

In accordance with a further aspect of the present invention, a touch screen display (not shown) may suitably be employed to allow the operator to monitor, reconfigure, troubleshoot, and otherwise operate machine 100. More particularly, a touch screen display panel may be configured to display, preferably in three dimensions, a graphical representation of the various operational features of machine 100 described above. For example, if the operator desires to load a new cassette into load station 102, the operator may press a graphical icon representative of load station 102 on the touch screen display. The touch screen display may then prompt the operator with questions, or may simply permit the operator to touch the door associated with the cassette loading function to thereby open the door. This model of touch screen interaction may be applied to virtually any aspect of machine 100 described herein.

Although the present invention has been described in conjunction with appended drawing figures, it will be appreciated that the invention is not so limited. Various additions, deletions, substitutions, and rearrangement of parts and processing steps may be made in the design and implementation of the subject cleaning system without departing from the spirit and scope of the subject invention, as set forth more particularly in the appended claims.

We claim:

1. An apparatus for cleaning and drying semiconductor wafer workpieces, said apparatus comprising:
   a first load assembly and a second load assembly each configured to discharge workpieces onto a single water track;
   a scrubber box configured to receive workpieces from said water track and to clean the upper and lower surfaces of each workpiece;
   a rinse station configured to receive workpieces from said scrubber box and to subsequently rinse the workpieces; and a spin-dry station configured to dry workpieces following treatment by said rinse station.

2. An apparatus according to claim 1, further comprising an unload station configured to retrieve workpieces from said spin-dry station and to alternately load said workpieces into a plurality of separate unloading cassettes.

3. An apparatus according to claim 1, wherein said first and second load assemblies are configured to discharge workpieces in a substantially orthogonal direction relative to said water track.

4. An apparatus according to claim 1, wherein said first and second load assemblies are offset from one another such that workpieces discharged from one of said first and second load assemblies do not contact the other one of said first and second load assemblies.

5. An apparatus according to claim 1, wherein said first and second load assemblies are configured such that one of said first and second load assemblies serially discharges its associated workpieces before the other one of said first and second load assemblies begins discharging its associated workpieces.

6. An apparatus according to claim 1, wherein said rinse station comprises:

a first ring assembly configured to receive a first workpiece at a transfer position associated with said cleaning station;

a second ring assembly configured to receive a second workpiece at said transfer position; and a shuttle arm upon which said first and second ring assemblies are mounted, said shuttle arm being configured to shift from a first position in which said first ring assembly is substantially aligned with said transfer position to a second position in which said second ring assembly is substantially aligned with said transfer position.

7. An apparatus according to claim 6, wherein said first ring assembly comprises:

a ring body mounted to said shuttle arm;

a fluid manifold located on said ring body and in communication with a fluid supply; and a plurality of jets arranged around said ring body and in communication with said fluid manifold, said jets being configured such that fluid ejected therefrom supports said first workpiece when said first workpiece is received by said first ring assembly.

8. An apparatus according to claim 1, wherein said water track comprises a plurality of fluid jets configured to discharge fluid for urging workpieces from said first and second load assemblies to said scrubber box.

9. An apparatus according to claim 8, wherein said fluid jets are oriented to discharge fluid upwardly at an angle in the range of 20 to 70 degrees relative to the plane substantially defined by workpieces present upon said water track.

10. An apparatus according to claim 8, wherein said fluid jets are configured such that workpieces received from said first and second load assemblies travel along said water track with substantially no mechanical contact with said water track.

11. An apparatus according to claim 1, further comprising means for regulating the volume rate of fluid flow to at least said water track, said scrubber box, and said rinse station.

12. An apparatus according to claim 1, further comprising a transfer station configured to retrieve workpieces from said rinse station and to transfer workpieces to said spin-dry station.

13. A method for cleaning semiconductor wafer workpieces in an integral, self-contained machine, said method comprising the steps of:

serially discharging a first number of workpieces from a first load cassette onto a water track;

thereafter serially discharging a second number of workpieces from a second load cassette onto said water track;

guiding said first and second number of workpieces on said water track in a substantially non-contacting manner into a scrubber box;

simultaneously cleaning the top and bottom surfaces of each of said workpieces in said scrubber box;

rinsing each of said workpieces at a rinse station to produce a corresponding rinsed workpiece;

spin-drying each of said rinsed workpieces in at least one spin assembly to obtain a corresponding number of dried workpieces; and thereafter placing said dried workpieces into at least one unload cassette.

14. A method according to claim 13, wherein said rinsing step comprises the steps of:

receiving, in a first rinse ring associated with a rinse station, a first one of said workpieces from said scrubber box;

thereafter receiving, in a second rinse ring associated with said rinse station, a second one of said workpieces from said scrubber box; and transferring rinsed workpieces from said first and second rinse rings to respective first and second spin assemblies.

15. A method according to claim 13, wherein said cleaning step comprises the steps of:

driving said workpieces with a pair of drive rollers comprising an upper drive roller disposed above said workpieces and a lower drive roller disposed below said workpieces; and cleaning said workpieces with a pair of cleaning rollers comprising an upper cleaning roller disposed above said workpieces and a lower cleaning roller disposed below said workpieces.

16. A method according to claim 15, further comprising the steps of:

rotating said pair of drive rollers at a first speed; and rotating at least one roller from said pair of cleaning rollers at a second speed, said second speed being higher than said first speed.

17. A method according to claim 15, further comprising the steps of:

rotating said upper and lower drive rollers in opposite directions relative to each other; and rotating said upper and lower cleaning rollers in the same direction relative to each other.

18. A method according to claim 13, wherein, for each of said workpieces, said cleaning step comprises the steps of:

applying a first fluid in the vicinity of a first number of cleaning rollers disposed within said scrubber box;

applying a second fluid in the vicinity of a second number of cleaning rollers disposed within said scrubber box;

initially scrubbing a workpiece with said first number of cleaning rollers; and subsequently scrubbing said workpiece with said second number of cleaning rollers.

19. A method according to claim 13, wherein said spin-drying step comprises the steps of:

initially accelerating said at least one spin assembly from a rest position to a clamping speed in a substantially linear manner and at a first acceleration rate; and subsequently accelerating said at least one spin assembly from said clamping speed to an operating speed in a substantially linear manner and at a second acceleration rate.

20. A method according to claim 19, wherein said first acceleration rate is lower than said second acceleration rate.

21. A method according to claim 19, further comprising the steps of:
rotating said at least one spin assembly at said operating speed for a predetermined time period; and
thereafter decelerating said at least one spin assembly from said operating speed to said rest position in a substantially linear manner.

22. A method according to claim 21, wherein said predetermined time period is in the range of 4 to 20 seconds.

23. A method according to claim 21, wherein said decelerating step is performed during a time period in the range of 4 to 30 seconds.

24. A method according to claim 19, wherein said subsequent accelerating step is performed during a time period in the range of 4 to 30 seconds.

25. A method according to claim 19, wherein said first acceleration rate is in the range of 20 to 1,000 rpm/second/second.

26. A method according to claim 13, further comprising the step of regulating the volume rate of fluid flow to at least said water track, said scrubber box, and said rinse station.

27. A system for cleaning and drying workpieces, said system comprising:
an load assembly configured to discharge a workpiece onto a water track;
a scrubber box configured to receive said workpiece from said water track and to clean said workpiece, said scrubber box comprising:
a plurality of roller pairs contained within said scrubber box, said plurality of roller pairs comprising a pair of drive rollers and a pair of cleaning rollers, said cleaning rollers being configured to simultaneously clean upper and lower surfaces of said workpiece;
a rinse station configured to receive said workpiece from said scrubber box and to subsequently rinse said workpiece; and
a spin-dry station configured to dry said workpiece following treatment by said rinse station.

28. A system according to claim 27, wherein:
said pair of drive rollers comprises an upper drive roller and a lower drive roller configured such that, in operation, said workpiece passes between said upper and lower drive rollers; and
said pair of cleaning rollers comprises an upper cleaning roller and a lower cleaning roller configured such that, in operation, said workpiece passes between said upper and lower cleaning rollers.

29. A system according to claim 28, wherein:
said pair of drive rollers is configured to rotate at a first speed;
at least one roller from said pair of cleaning rollers is configured to rotate at a second speed; and
said second speed is higher than said first speed.

30. A system according to claim 28, wherein said upper cleaning roller rotates at a third speed, said lower cleaning roller rotates at said second speed, and said third speed is higher than said second speed.

31. A system according to claim 28, wherein:
said upper and lower drive rollers are configured to rotate in opposite directions relative to each other; and
said upper and lower cleaning rollers are configured to rotate in the same direction relative to each other.

32. A system according to claim 27, further comprising a top panel having a plurality of fluid inlet ports configured to distribute fluid to predetermined ones of said plurality of roller pairs.

33. A system according to claim 32, further comprising a number of fluid channels in communication with corresponding ones of said fluid inlet ports, said fluid channels being configured to release fluid substantially along the length of said predetermined roller pairs.

34. A system according to claim 32, wherein:
a first of said fluid inlet ports is configured to apply a first fluid in the vicinity of a first number of cleaning rollers disposed within said scrubber box; and
a second of said fluid inlet ports is configured to apply a second fluid in the vicinity of a second number of cleaning rollers disposed within said scrubber box.

35. A system according to claim 27, wherein said scrubber box is configured as a self-contained, modular unit adapted to be removable from said system as an integral unit.

36. An apparatus for cleaning and drying workpieces, said apparatus comprising:
an load assembly configured to discharge a workpiece onto a water track;
a scrubber box configured to receive said workpiece from said water track and to clean said workpiece;
a rinse station configured to receive said workpiece from said scrubber box and to subsequently rinse said workpiece; and
a spin-dry station configured to dry said workpiece following treatment by said rinse station, said spin-dry station comprising:
a spin platform configured to hold said workpiece during spin-drying;
a drive shaft coupled to said spin platform; and
a drive motor coupled to said drive shaft and configured to impart a variable rotational speed to said drive shaft, said drive motor exhibiting a first substantially linear acceleration ramp from a resting position to a first predetermined rotational speed.

37. An apparatus according to claim 36, wherein said drive motor is adapted to follow a second substantially linear acceleration ramp from approximately said first predetermined rotational speed to a second predetermined rotational speed.

38. An apparatus according to claim 37, wherein said first predetermined rotational speed is lower than said second predetermined rotational speed.

39. An apparatus according to claim 36, further comprising means for clamping said workpiece during spin-dying, said means for clamping being configured to engage said workpiece when said spin platform reaches a predetermined rotational speed.

40. An apparatus according to claim 39, wherein said means for clamping comprises a plurality of bobs, each having:
an upper body;
a lower body;
a pivot arm located proximate said lower body;
a clamp element located on said upper body, said clamp element being configured for compatibility with said workpiece; and
a support button located on said upper body, said support button being configured to support said workpiece when said clamp element is disengaged from said workpiece.

41. An apparatus according to claim 36, further comprising a transfer station configured to retrieve said workpiece from said rinse station and to transfer said workpiece to said spin-dry station.

* * * * *